US009985060B2

(12) United States Patent
Kobayashi et al.

(10) Patent No.: US 9,985,060 B2
(45) Date of Patent: May 29, 2018

(54) IMAGE PICKUP APPARATUS, IMAGE PICKUP SYSTEM, AND IMAGE PICKUP APPARATUS DRIVING METHOD

(71) Applicant: CANON KABUSHIKI KAISHA, Tokyo (JP)

(72) Inventors: Masahiro Kobayashi, Tokyo (JP); Yuichiro Yamashita, Hsinchu (TW); Ginjiro Toyoguchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 193 days.

(21) Appl. No.: 14/973,504

(22) Filed: Dec. 17, 2015

(65) Prior Publication Data

US 2016/0104732 A1    Apr. 14, 2016

Related U.S. Application Data

(62) Division of application No. 13/765,025, filed on Feb. 12, 2013, now Pat. No. 9,502,452.

(30) Foreign Application Priority Data

Feb. 17, 2012 (JP) ................................ 2012-033356

(51) Int. Cl.
| | | |
|---|---|---|
| *H01L 27/14* | (2006.01) | |
| *H01L 27/146* | (2006.01) | |
| *H04N 5/341* | (2011.01) | |
| *H04N 5/3745* | (2011.01) | |
| *H04N 5/378* | (2011.01) | |

(52) U.S. Cl.
CPC .. *H01L 27/14609* (2013.01); *H01L 27/14612* (2013.01); *H04N 5/341* (2013.01); *H04N 5/378* (2013.01); *H04N 5/37452* (2013.01); *H01L 27/14605* (2013.01)

(58) Field of Classification Search
CPC ......... H01L 27/14609; H01L 27/14643; H01L 27/14603
See application file for complete search history.

(56) References Cited

U.S. PATENT DOCUMENTS 8,817,150 B2 * 8/2014 Giffard ............. H01L 27/14603
348/294

FOREIGN PATENT DOCUMENTS

| JP | 2009-296574 A | 12/2009 |
|---|---|---|
| JP | 2010178117 A | 8/2010 |

* cited by examiner

*Primary Examiner* — Tony Ko
(74) *Attorney, Agent, or Firm* — Canon U.S.A., Inc. IP Division

(57) ABSTRACT

Each of multiple pixels includes a photoelectric conversion unit. A first holding unit is configured to hold a charge generated by the photoelectric conversion unit, at a location different from location of the photoelectric conversion unit. A second holding unit is configured to hold a charge held by the first holding unit at a location different from locations of both of the first holding unit and the photoelectric conversion unit. An amplifying unit includes an input node different from the second holding unit and is configured to output a signal based on a charge transferred to the input node from the second holding unit. A first discharge unit includes a charge draining node which is electrically connected to a line where a predetermined voltage is supplied. The first discharge unit discharges a charge held by the first holding unit to the charge draining node.

10 Claims, 19 Drawing Sheets

IMAGE PICKUP APPARATUS, IMAGE PICKUP SYSTEM, AND IMAGE PICKUP APPARATUS DRIVING METHOD

CROSS-REFERENCE TO RELATED APPLICATION

This application is a Divisional of U.S. application Ser. No. 13/765,025, filed Feb. 12, 2013, which claims priority from Japanese Patent Application No 2012-033356 filed Feb. 17, 2012, which are hereby incorporated by reference herein in their entireties.

BACKGROUND OF THE INVENTION

Field of the Invention

One disclosed aspect of the embodiments relates to an image pickup apparatus, an image pickup system, and an image pickup apparatus driving method.

Description of the Related Art

In recent years, owing to further improvement in the performance of image pickup apparatuses, there has been studied a configuration including a charge holding unit within a pixel separately from a photoelectric conversion unit and a floating diffusion (hereinafter, FD). As for usage of the holding unit, the holding unit is provided to realize a global electronic shutter as disclosed in Japanese Patent Laid-Open No. 2009-296574.

SUMMARY OF THE INVENTION

Some embodiments relate to an image pickup apparatus including a plurality of pixels. The plurality of pixels each include a photoelectric conversion unit. The plurality of pixels each include a first holding unit configured to hold a charge generated by the photoelectric conversion unit, at a location different from the photoelectric conversion unit. The plurality of pixels each include a second holding unit configured to hold a charge held by the first holding unit at a location different from both of the first holding unit and the photoelectric conversion unit. The plurality of pixels each include an amplifying unit including an input node and configured to output a signal based on a charge transferred to the input node from the second holding unit. The input node is a different node from the second holding unit. The plurality of pixels each include a first discharge unit configured to discharge a charge of the first holding unit. The first discharge unit includes a charge draining node. The charge draining node is electrically connected to a line to which a predetermined voltage is to be supplied. The first discharge unit is configured to discharge a charge held by the first holding unit holds to the charge draining node.

Some embodiments relate to a driving method of an image pickup apparatus having a plurality of pixels. Each of the plurality of pixels includes a first holding unit configured to hold a charge generated by a photoelectric conversion unit, at a location different from the photoelectric conversion unit, and a second holding unit configured to hold a charge held by the first holding unit at a location different from both of the photoelectric conversion unit and the first holding unit. The driving method according to the embodiments includes a transfer step to transfer a charge held by the first holding unit to the second holding unit. The driving method according to the embodiments includes a discharge step to discharge a charge of the first holding unit via a path different from a charge transfer path of the transfer step.

Some embodiments relate to a driving method of an image pickup apparatus having a plurality of pixels. Each of the plurality of pixels include a first holding unit configured to hold a charge generated by a photoelectric conversion unit, at a location different from the photoelectric conversion unit, and a second holding unit configured to hold a charge held by the first holding unit at a location different from both of the photoelectric conversion unit and the first holding unit. The driving method according to the embodiments includes a transfer step to transfer a charge held by the first holding unit to the second holding unit. The driving method according to the embodiments includes a discharge step to discharge a charge of the first holding unit. The discharge step is performed when the second holding unit holds a charge.

Some embodiments relate to a driving method of an image pickup apparatus having a plurality of pixels. Each of the plurality of pixels include a first holding unit configured to hold a charge generated by a photoelectric conversion unit, at a location different from the photoelectric conversion unit, and a second holding unit configured to hold a charge held by the first holding unit at a location different from both of the photoelectric conversion unit and the first holding unit. The driving method according to the embodiments includes a transfer step to transfer a charge held by the first holding unit to the second holding unit. The transfer step is repeatedly executed. The driving method according to the embodiments includes a discharge step to discharge a part of charges held by the first holding unit in between two consecutive executions of the transfer step.

Further features of the disclosure will become apparent from the following description of exemplary embodiments with reference to the attached drawings.

DESCRIPTION OF THE EMBODIMENTS

One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

According to one or more embodiments, image quality may be improved with an image pickup apparatus having a pixel configuration which enables a global electronic shutter.

The image pickup apparatus includes, within pixels, a photoelectric conversion unit, a first holding unit capable of holding a signal charge generated at the photoelectric conversion unit, and a second holding unit capable of holding a signal charge transferred from the first holding unit. According to such a configuration, a charge can be held at the second holding unit during a period in which a signal charge generated at the photoelectric conversion unit is being held at the photoelectric conversion unit and the first holding unit.

According to one or more embodiments, noise due to residual charge at the first holding unit can be reduced by resetting the charge at the first holding unit with such a configuration.

Figure 2:
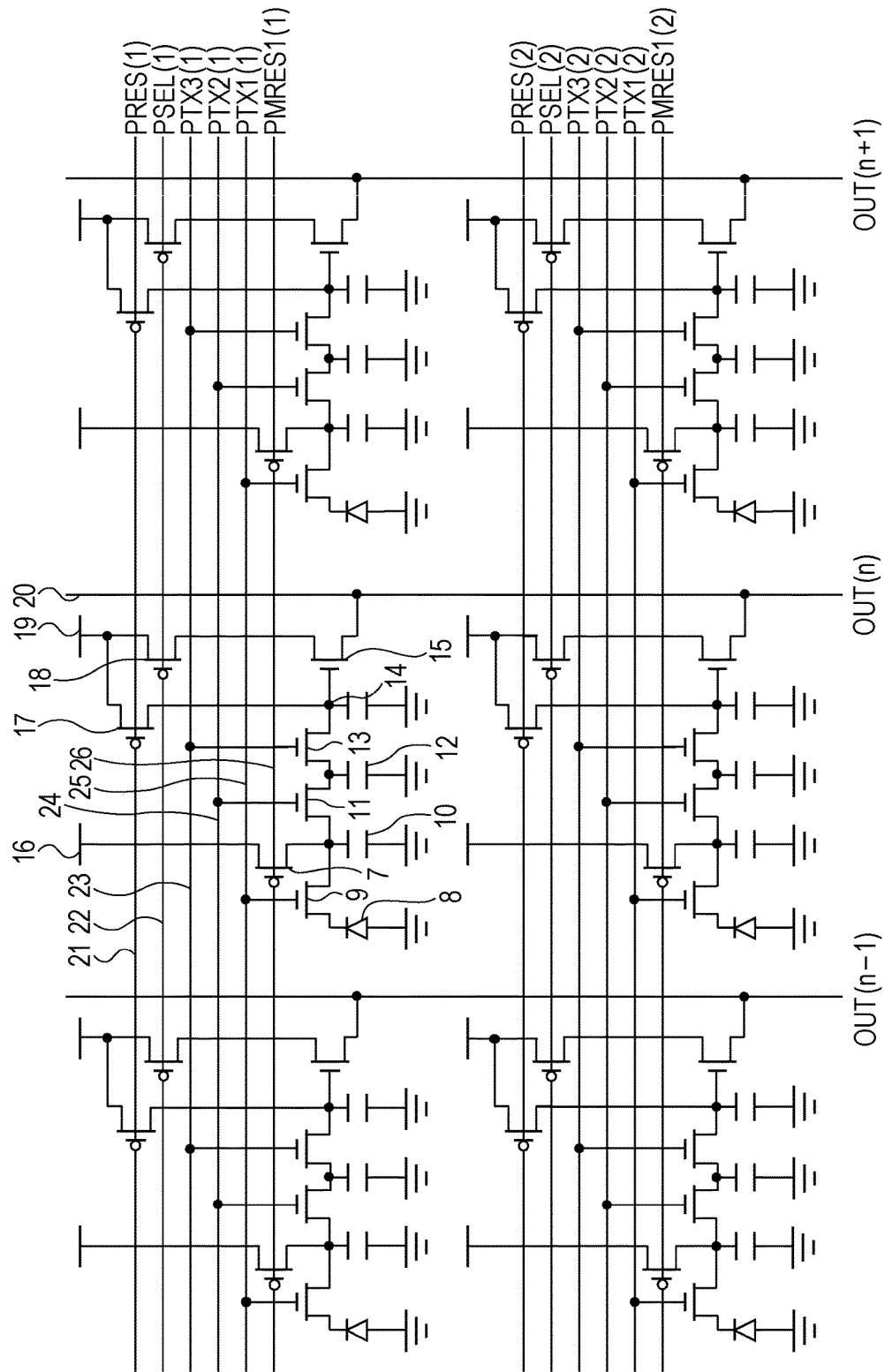
FIG. 2 is a diagram illustrating an equivalent circuit of an embodiment of the image pickup apparatus.

One or more embodiments will be described with reference to the drawings. An image pickup apparatus according to one or more embodiments includes multiple pixels. FIG. 2 illustrates an example of an equivalent circuit of the pixels of the image pickup apparatus. As illustrated in FIG. 2, the pixels include a photoelectric conversion unit 8, a first holding unit 10 which holds charge at a place or location different from the place or location of the photoelectric conversion unit 8, and a second holding unit 12 which holds the charge held at the first holding unit 10 at a place or location different from the place or location of the photoelectric conversion unit 8 and the first holding unit 10.

Figure 3:
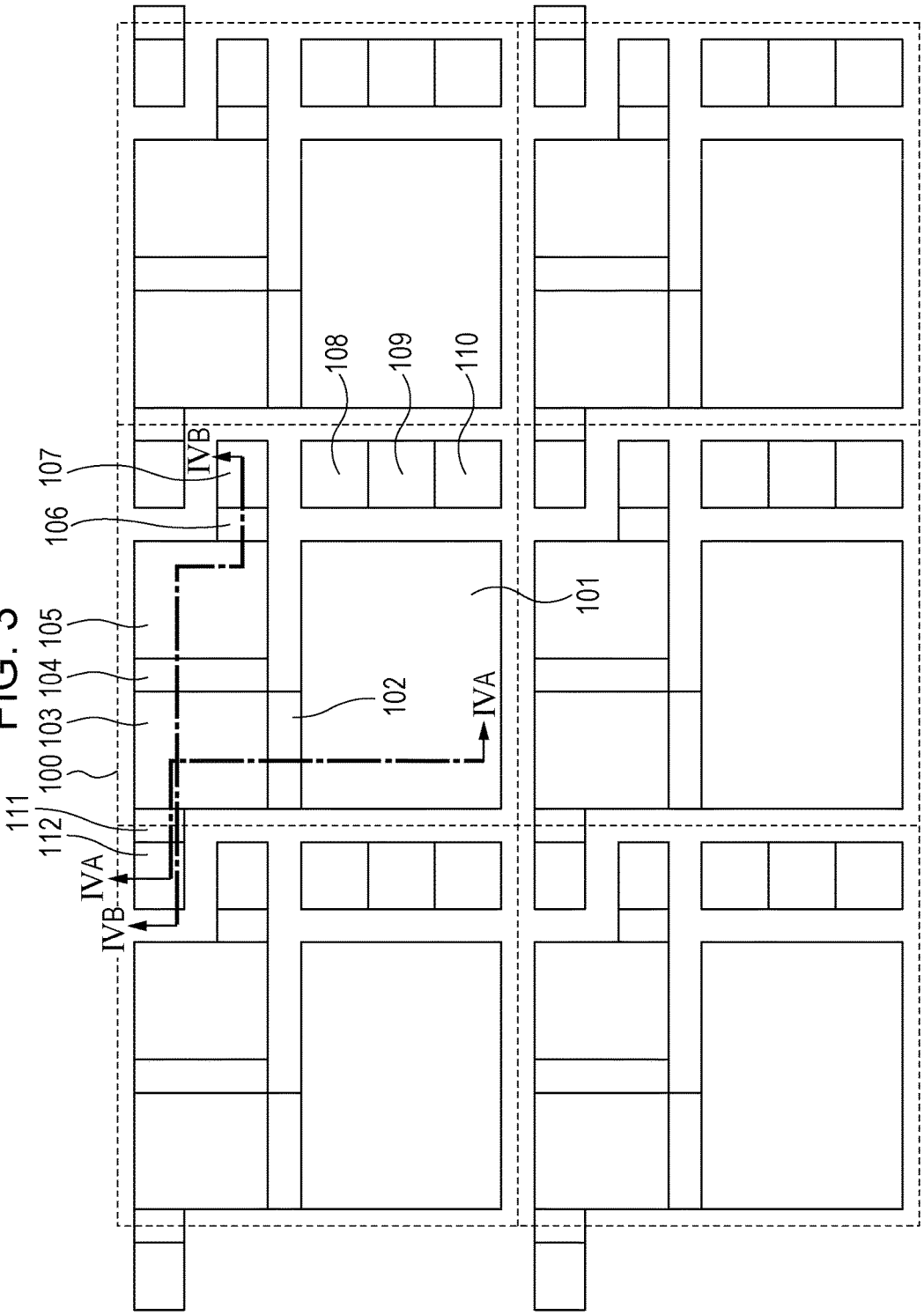
FIG. 3 is a schematic view illustrating the top face of an embodiment of the image pickup apparatus.

FIG. 3 illustrates an example of a top face view of the pixels. The photoelectric conversion unit 8 is disposed at a place indicated by an area 101. The first holding unit 10 is disposed at a place or location indicated by an area 103. The second holding unit 12 is disposed at a place or location indicated by an area 105. Thus, the photoelectric conversion unit 8, the first holding unit 10, and the second holding unit 12 are disposed at places or locations different from each other.

In one or more embodiments, the charge of the first holding unit 10 is discharged. Accordingly, holding a charge at the first holding unit 10 can be started in a state where there is little or not residual charge in the first holding unit 10, for example. As a result, image quality of the image pickup apparatus can be improved.

Discharge of the charge from the first holding unit 10 can be performed via a path different from the transfer path via which the charge is transferred from the first holding unit 10 to the second holding unit 12. In the example in FIG. 3, the transfer path via which the charge is transferred from the first holding unit 10 to the second holding unit 12 is indicated as region 104, and the path via which the charge is discharged from the first holding unit 10 is indicated as region 111.

From a different perspective, discharge of the charge from the first holding unit 10 is performed when the second holding unit 12 is holding a charge. From yet another perspective, transfer of charge from the first holding unit 10 to the second holding unit 12 is repeatedly performed, and part of the charge accumulated in the first holding unit 10 is discharged in between transfers. Part of the charge accumulated in the first holding unit 10 in between transfers is, for example, charge which has been mixed in the first holding unit 10 during a shutter period.

Also, one or more embodiments according to the image pickup apparatus may include a first charge discharge unit 7. The first charge discharge unit 7 includes a charge draining node serving as a charge discharge destination. The charge draining node may be configured including a semiconductor region. Alternatively, the charge draining node may be configured including a conductor. Alternatively, the charge draining node may be configured including a semiconductor region and a conductor in contact with the semiconductor region. A predetermined voltage is supplied to the charge draining node. The predetermined voltage is, for example, a power source voltage. According to such a configuration, the above-described reset operation can be performed.

Note that discharge of charge is transfer of the charge from the first holding unit 10 to a discharge destination. This movement of charge may be realized by lowering the potential of the charge draining node lower than the potential of the first holding unit 10. Also, discharge of the charge may be controlled by a control electrode.

Hereinafter, embodiments will be described. Here, "first conductive-type" and "second conductive-type" are terms to be used for representing mutually different conductive types. In the event that "first conductive-type" is N type, "second conductive-type" is P type. In the event that "first conductive-type" is P type, "second conductive-type" is N type. Hereinafter, for simplification of description, an example will be described wherein "first conductive-type" is N type, and "second conductive-type" is P type. However, the disclosure is not restricted to this, and may also be applied to a case where "first conductive-type" is P type, "second conductive-type" is N type. In the event that the semiconductor region making up the holding unit is N type, electrons caused due to photoelectric conversion and of positive holes electrons are accumulated in the holding unit. In the event that the semiconductor region making up the holding unit is P type, electrons caused due to photoelectric conversion and of positive holes positive holes are accumulated in the holding unit.

Also, hereinafter, an embodiment of a pixel-amplification-type image pickup apparatus having an amplifier unit for each pixel will be described. The disclosure is not restricted to this, and may include a charge holding unit and various sensors having a transfer unit which transfers charge held at the holding unit.

First Embodiment

An embodiment of the image pickup apparatus will be described. With regard to some embodiments, a feature thereof is in that pixels include a first holding unit 10, a second holding unit 12, and a first charge discharging unit configured to discharge charge held at the first holding unit 10.

Figure 1:
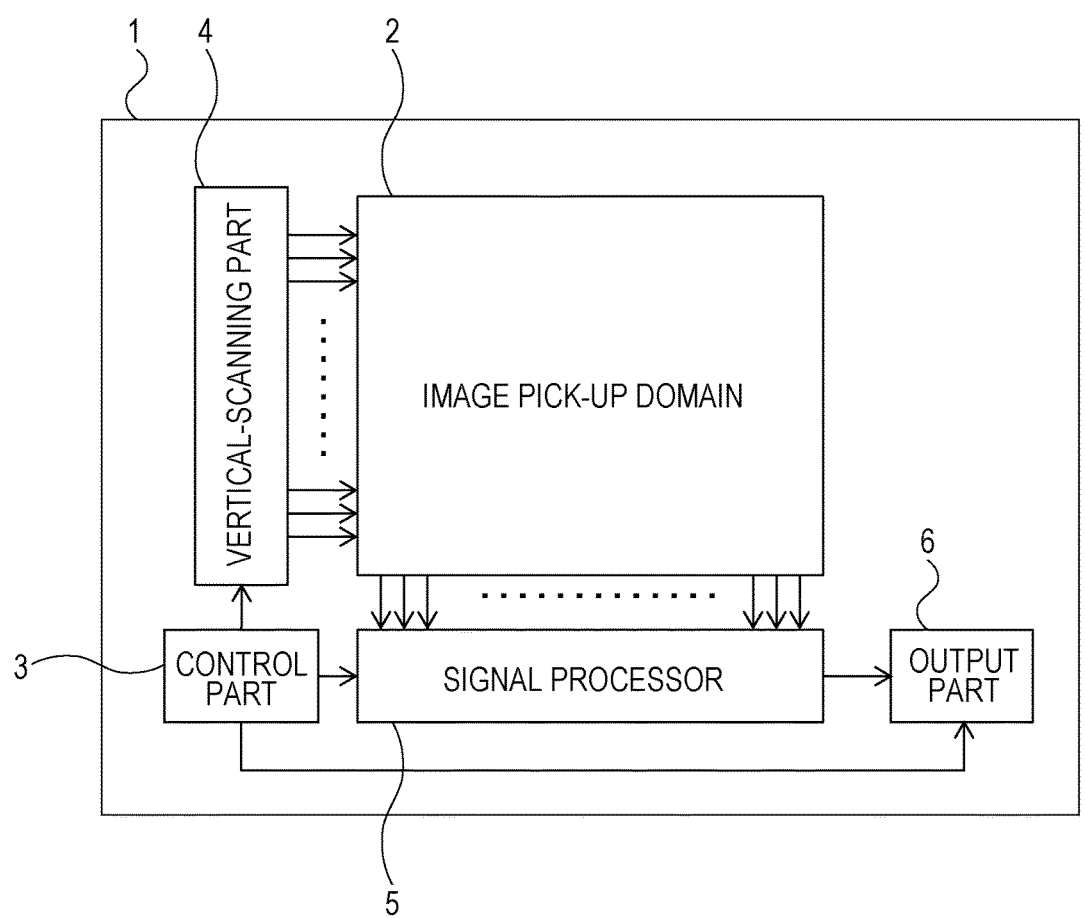
FIG. 1 is a block diagram of an embodiment of an image pickup apparatus.

FIG. 1 is an overall block diagram of image pickup apparatuses according to some embodiments. An image pickup apparatus 1 may be configured of one chip using a semiconductor substrate. The image pickup apparatus 1 includes multiple pixels disposed in an image pickup area 2. Further, the image pickup apparatus 1 includes a control unit 3. The control unit 3 supplies a control signal, power supply voltage, and so forth to a vertical scanning unit 4, a signal processing unit 5, and an output unit 6.

The vertical scanning unit 4 supplies a driving pulse to multiple pixels disposed in the image pickup area 2. Usually, the vertical scanning unit 4 supplies a driving pulse for each pixel row or for every multiple pixel rows. The vertical scanning unit 4 may be configured of a shift register or address decoder.

The signal processing unit 5 is configured to include a column circuit, a horizontal scanning circuit, and a horizontal output line. The column circuit is configured of multiple circuit blocks which each receive the signals of multiple pixels included in a pixel row selected by the vertical scanning unit 4. Each of the circuit blocks may be configured of one or all of a memory unit, an amplifier circuit, a denoising circuit, and an analog-to-digital conversion circuit, or a combination of these. These circuits may be a circuit which processes digital signals or may be a circuit which processes analog signals. The horizontal scanning circuit may be configured of a shift register or address decoder.

The output unit 6 outputs a signal transmitted via a horizontal output line out of the image pickup apparatus 1. The output unit 6 is configured to include a buffer or amplifier circuit.

FIG. 2 illustrates an equivalent circuit of image pickup apparatuses according to some embodiments. Here, though six pixels in a total of two rows by three columns are illustrated, an image pickup area may be configured by an even greater number of pixels being disposed.

The photoelectric conversion unit 8 converts incident light into signal charge (electron or positive hole). A photodiode is illustrated as an example of the photoelectric conversion unit 8.

The first charge transfer unit 9 transfers charge generated at the photoelectric conversion unit 8 to a circuit element on the subsequent stage. Hereinafter, a case where electrons are employed as signal charge will be described as an example. The first charge transfer unit 9 is configured to include a control electrode disposed on the semiconductor substrate via an insulating film.

The first holding unit 10 holds electrons generated at the photoelectric conversion unit 8. The second charge transfer unit 11 transfers the electrons held at the first holding unit 10 to a circuit element on the subsequent stage. The second charge transfer unit 11 is configured to include a control electrode disposed on the semiconductor substrate via an insulating film.

The second holding unit 12 holds the electrons transferred from the first holding unit 10 via the second charge transfer unit 11. The third charge transfer unit 13 transfers the electrons held at the second holding unit 12 to the circuit element on the subsequent stage. The third charge transfer unit 13 may be configured to include a control electrode disposed on the semiconductor substrate via the insulating film.

An input node 14 of an amplifier unit 15 is configured so as to hold electrons transferred from the second holding unit 12 via the third charge transfer unit 13. The input node 14 of the amplifier unit 15 may be configured to include a floating diffusion area (hereinafter, FD area) disposed in the semiconductor substrate. The amplifier unit 15 outputs a signal based on electrons transferred to the input node 14 to a vertical signal line 20. Here, a MOS transistor (hereinafter, amplifier transistor) is employed as the amplifier unit 15. For example, the amplifier transistor makes up a source follower circuit. Also, the third charge transfer unit 13 is disposed in an electrical path between the input node 14 of the amplifier unit 15 and the second holding unit 12. That is to say, the input node 14 of the amplifier unit 15 and the second holding unit 12 are different nodes. The configuration is not restricted to such an example, and as long as two nodes are configured so as to be electrically insulated, these nodes are different nodes.

A first charge discharging unit 7 transfers the electrons held at the first holding unit 10 to an overflow drain area (hereinafter, OFD area). The OFD area is a charge discharging node from which charge is discharged. The OFD area may be configured of an N-type semiconductor region electrically connected to the wiring 16 which supplies power supply voltage, for example. The first charge discharging unit 7 is configured to include a control electrode disposed on the semiconductor substrate via the insulating film. Discharging of the charge of the first holding unit 10 is controlled by voltage to be supplied to the control electrode of the first charge discharging unit 7.

With some embodiments, an electronic shutter operation may be performed by the first charge transfer unit 9 and first charge discharging unit 7. That is to say, a period to discharge electrons generated at the photoelectric conversion unit 8 (shutter period) and a period to accumulate electrons (exposure period) may be controlled by controlling the first charge transfer unit 9 and first charge discharging unit 7.

A reset unit 17 supplies reference voltage to the input node 14 of the amplifier unit 15. In other words, the reset unit 17 resets the voltage at the input node 14 of the amplifier unit 15. Here, a MOS transistor (hereinafter, reset transistor) is employed as the reset unit 17. Note that, with some embodiments, the reset unit 17 may be omitted. This is because reset of a pixel may be performed by the first charge discharging unit 7.

A selecting unit 18 selects each pixel to read out the signal of a pixel to a vertical signal line 20 for each pixel or for every pixel row. Here, a MOS transistor (hereinafter, selecting transistor) is employed as the selecting unit 18. Note that the selecting unit 18 may be disposed in a path between the amplifier unit 15 and the vertical signal line 20. Alternatively, the selecting unit 18 may be omitted. With an example of the selecting unit 18 being omitted, a pixel is selected by voltage that the reset unit 17 supplies to the input node 14 of the amplifier unit 15.

Predetermined voltage is supplied to the drain of the reset transistor and the drain of the selecting transistor via a wiring 19. The predetermined voltage is power supply voltage, for example. Note that, in the event that the selecting unit 18 has been disposed in a path between the amplifier unit 15 and the vertical signal line 20, and also in the event that the selecting unit 18 has been omitted, the drain of the amplifier transistor is connected to the wiring 19.

A reset control wiring 21 supplies a driving pulse PRES to the gate of the reset transistor. A selection control wiring 22 supplies a driving pulse PSEL to the gate of the selecting transistor. A third transfer control wiring 23 supplies a driving pulse PTX3 to a control electrode (hereinafter, third control gate) making up the third charge transfer unit 13. A second transfer control wiring 24 supplies a driving pulse PTX2 to a control electrode (hereinafter, second control gate) making up the second charge transfer unit 11. A first transfer control wiring 25 supplies a driving pulse PTX1 to a control electrode (hereinafter, first control gate) making up the first charge transfer unit 9. A fourth transfer control wiring 26 supplies a driving pulse PMRES1 to a control electrode (hereinafter, fourth control gate) making up the first charge discharging unit 7. The height of the potential barrier of the semiconductor region below each of the control gates may be changed by changing a pulse value to be supplied to each of the control gates. That is to say, each of the charge transfer units and charge discharging unit may control the potential of the charge transfer path to be disposed below the control electrode.

With some embodiments, at the pixel configuration illustrated with the equivalent circuit exemplified in FIG. 2, the electrical path between the photoelectric conversion unit 8 and the first holding unit 10 may have the following configuration. The configuration thereof is a configuration wherein the first charge transfer unit 9 disposed in the electrical path between the photoelectric conversion unit 8 and the first holding unit 10 is in a non-conductive state, and electrons are allowed to be moved from the photoelectric conversion unit 8 to the first holding unit 10. Here, the non-conductive state is a state in which of pulse values to be supplied to the first charge transfer unit 9, a pulse value to generate the highest potential barrier has been supplied. Accordingly, the first charge transfer unit 9 does not have to be so-called completely off, and the non-conductive state of the first charge transfer unit 9 also includes a state in which some sort of potential barrier has occurred as compared to a case where the first charge transfer unit 9 has completely been turned on.

For example, in the event that a MOS transistor is the first charge transfer unit 9, a specific configuration may be made by this MOS transistor having an embedded channel configuration. More generally speaking, this configuration is a configuration wherein there is a portion in an area deeper than the surface where the potential barrier for an electrode is lower than the surface when the first charge transfer unit 9 is in a non-conductive state. In this case, a driving pulse to be supplied to the first charge transfer unit 9 may be a fixed value. That is to say, s fixed potential barrier may be employed instead of a configuration wherein two states of a conductive state and a non-conductive state are switchable.

According to such a configuration, when light is input to the photoelectric conversion unit 8, almost of electrons generated by photoelectric conversion are moved to the first holding unit 10 during the exposure period. Accordingly, the accumulation periods of all of the pixels disposed in the image pickup area 2 may be aligned by performing transfer of charge from the first holding unit 10 to the second holding unit 12 in parallel.

Further, when the first charge transfer unit 9 is in a non-conductive state, a hole is accumulated on the surface. Also, the channel where electrons move exists in a predetermined depth portion from the surface, and accordingly, influence of dark current may be reduced as compared to a case where electrons move in an interface between the semiconductor substrate and the insulating film.

Alternatively, the electrical path between the photoelectric conversion unit 8 and the first holding unit 10 may have another configuration. The other configuration is a configuration wherein the first charge transfer unit 9 disposed in the electrical path between the photoelectric conversion unit 8 and the first holding unit 10 is in a non-conductive state, and no electrons are moved from the photoelectric conversion unit 8 to the first holding unit 10. Here, the non-conductive state is a state in which of pulse values to be supplied to the first charge transfer unit 9, a pulse value to generate the highest potential barrier has been supplied. In other words, this is a configuration wherein the majority of electrons generated by photoelectric conversion is accumulated in the photoelectric conversion unit 8.

During a period for accumulating electrons at the photoelectric conversion unit 8, a lower potential barrier than the potential barrier at the first charge transfer unit 9 is formed around the photoelectric conversion unit 8, and accordingly, a configuration wherein no electrons are moved from the photoelectric conversion unit 8 to the first holding unit 10 may be obtained. As for a specific configuration, when the first charge transfer unit 9 is in a non-conductive state, a potential barrier to be formed below the first control electrode is higher than a potential barrier to be formed between the photoelectric conversion unit 8 and another circuit element. The other circuit element is the OFD area of the first charge discharging unit 7, for example. Or, the other circuit element is the reset transistor, selecting transistor, amplifier transistor, or the like.

According to such a configuration, the majority of electrons generated by photoelectric conversion at the time of light being input to the photoelectric conversion unit 8 is accumulated in the photoelectric conversion unit 8 during the exposure period. Accordingly, with all of the pixels disposed in the image pickup area 2, charge accumulated in the photoelectric conversion units 8 is simultaneously transferred to the first holding unit 10, whereby the accumulation periods of all of the pixels may be aligned.

Specific configurations of pixels of some embodiments will be described with reference to FIGS. 3, 4A, and 4B. Members having the same name as a member described in FIG. 2 have the same function, and accordingly, detailed description will be omitted.

FIG. 3 illustrates a top view of image pickup apparatuses according to some embodiments. Here, though six pixels in a total of two rows by three columns are illustrated, an image pickup area may be configured by an even greater number of pixels being disposed.

Pixels 100 are configured of an N-type semiconductor region 101 making up the photoelectric conversion unit 8, a control electrode 102 making up the first charge transfer unit 9, an N-type semiconductor region 103 making up the first holding unit 10, a control electrode 104 making up the second charge transfer unit 11, an N-type semiconductor region 105 making up the second holding unit 12, a control electrode 106 making up the third charge transfer unit 13, an FD area 107, a reset transistor 108, an amplifier transistor 109, and a selecting transistor 110. Further, the pixels 100 include a control electrode 111 and an OFD area 112 which make up the first charge discharging unit 7. The FD area 107 is configured to include an N-type semiconductor region where electrons held at the second holding unit 12 are transferred. The OFD area 112 is configured to include an N-type semiconductor region where charge from the first holding unit 10 is discharged.

Note that the OFD area 112 may be shared with the source or drain of the reset transistor, selecting transistor, or amplifier transistor. That is to say, the charge of the first holding unit 10 is transferred to the source or drain of one of the reset transistor, selecting transistor, and amplifier transistor.

According to such a configuration, the area of the photoelectric conversion unit 8 may be increased, and accordingly, sensitivity may be improved.

A P-type semiconductor region 114 is disposed below the N-type semiconductor region 103. The N-type semiconductor region 103 and P-type semiconductor region 114 make up a PN junction. A P-type semiconductor region 115 is disposed below the N-type semiconductor region 105. The N-type semiconductor region 105 and P-type semiconductor region 115 make up a PN junction. Note that, with some embodiments, the P-type semiconductor region 114 and 115 may be omitted.

A feature of some embodiments is in that the first charge discharging unit 7 which discharges the charge of the N-type semiconductor region 103 of the first holding unit 10 in the pixels 100. The first charge discharging unit 7 may be a MOS transistor made up of the control electrode 111, N-type semiconductor region 103, and OFD area 112. The control electrode 111 included in the first charge discharging unit 7 is disposed adjacent to the N-type semiconductor region 103 with a planar view. According to such displacement, the first charge discharging unit 7 may discharge the charge of the first holding unit 10.

The charge of the photoelectric conversion unit 8 is passed through the semiconductor region below the control electrode 102 and transferred to the first holding unit 10. That is to say, the path where charge is transferred from the photoelectric conversion unit 8 to the first holding unit 10 is disposed below the control electrode 102. The charge of the first holding unit 10 is passed through the semiconductor region below the control electrode 102 and transferred to the second holding unit 12. That is to say, the path where charge is transferred from the first holding unit 10 to the second holding unit 12 is disposed below the control electrode 104. Also, the charge of the first holding unit 10 is passed through the semiconductor region below the control electrode 111 and discharged to the OFD area 112. That is to say, the path where charge is discharged from the first holding unit 10 is disposed below the control electrode 111. In this manner, the charge of the first holding unit 10 is discharged via a path different from both of the transfer path of charge from the photoelectric conversion unit 8 to the first holding unit 10 and the transfer path of charge from the first holding unit 10 to the second holding unit 12.

Figure 4A:
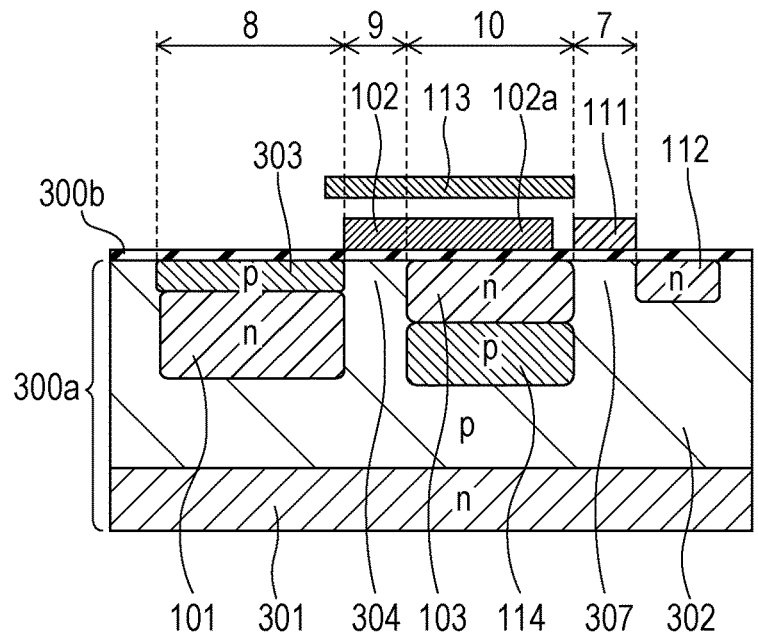
FIGS. 4A and 4B are schematic views of a cross section of an embodiment of the image pickup apparatus.
Figure 4B:
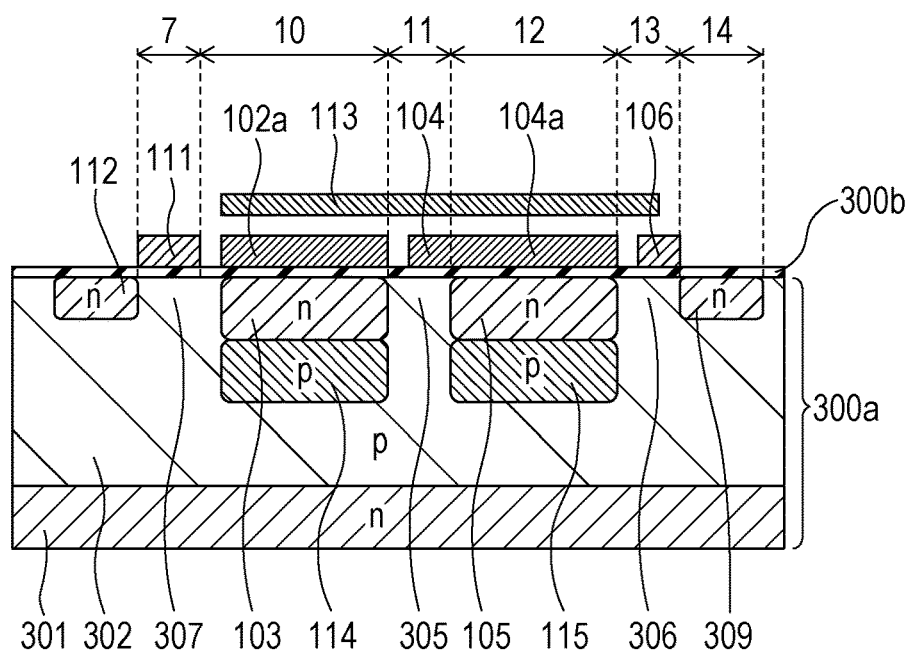

FIGS. 4A and 4B illustrate schematic views of the cross section along the lines IVA-IVA and IVB-IVB in FIG. 3. Members having the same function in FIG. 2 will be denoted with the same reference numeral, and detailed description will be omitted.

The image pickup apparatuses according to some embodiments include a semiconductor substrate 300a and an insulating film 300b disposed thereon. The semiconductor substrate 300a is silicon, for example. The semiconductor substrate 300a may include a semiconductor region formed with epitaxial growth. The insulating film 300b is a silicon oxide film, for example. A semiconductor region is formed within the semiconductor substrate 300a. Also, a control electrode is disposed on the semiconductor substrate 300a via the insulating film 300b.

An N-type semiconductor region 301 is disposed in the semiconductor substrate 300a. A P-type semiconductor region 302 is disposed on the N-type semiconductor are 301. The N-type semiconductor region 101 is disposed so as to make up a PN junction with the P-type semiconductor region 302. A P-type semiconductor region 303 is disposed on the surface side of the N-type semiconductor region 101, i.e., a side close to the insulating film 300b. A so-called embedded-type photodiode is made up of the P-type semiconductor region 302, N-type semiconductor region 101, and P-type semiconductor region 303.

Electrons generated at the photoelectric conversion unit 8 move in a first channel 304, and reach the N-type semiconductor region 103 which makes up the first holding unit 10. The electrons held at the N-type semiconductor region 103 move in a second channel 305, and reach an N-type semiconductor region 105 which makes up the second holding unit 12. The electrons held at the N-type semiconductor region 105 move in a third channel 306, and reach the N-type semiconductor region 107 which makes up the FD area. Also, the electrons of the first holding unit 10 may be discharged to the OFD area 112 via a channel 307 disposed below the control electrode 111.

The control electrode 102 is disposed on the upper portion of the first channel 304 via the insulating film 300b. With some embodiments, the control electrode 102 includes a portion 102a disposed on the N-type semiconductor region 103. The control electrode 102 is shared by the first charge transfer unit 9 and first holding unit 10. That is to say, potential between the photoelectric conversion unit 8 and the first holding unit 10 is controlled by voltage to be applied to the control electrode 102. Additionally, the potential of the first holding unit 10 is controlled by voltage to be applied to the control electrode 102. The first charge transfer unit 9 is configured to include the first channel 304 and a portion of the control electrode 102 disposed on the first channel 304 via the insulating film.

The first holding unit 10 includes the N-type semiconductor region 103 and the P-type semiconductor region 114 which makes up a PN junction with the N-type semiconductor region 103. Electrons are accumulated by the N-type semiconductor region 103 making up PN junction capacitance. Further, the first holding unit 10 is configured to include the portion 102a of the control electrode 102 disposed on the N-type semiconductor region 103 via the insulating film. An inversion layer may be formed on the interface 300 side of the N-type semiconductor region 103 by voltage to be applied to the control electrode 102. Thus, mixing of dark current into the first holding unit 10 may be reduced.

The control electrode 104 is disposed on the second channel 305 via the insulating film 300b. With some embodiments, the control electrode 104 includes a portion 104a disposed on the N-type semiconductor region 105. The control electrode 104 is shared by the second charge transfer unit 11 and second holding unit 12. That is to say, potential between the first holding unit 10 and the second holding unit 12 is controlled by voltage to be applied to the control electrode 104. Additionally, the potential of the second holding unit 12 is controlled by voltage to be applied to the control electrode 104. The second charge transfer unit 11 is configured to include the second channel 305 and a portion of the control electrode 104 disposed on the second channel 305 via the insulating film.

The second holding unit 12 includes the N-type semiconductor region 105 and the P-type semiconductor region 115 which makes up a PN junction with the N-type semiconductor region 105. Electrons are accumulated by the N-type semiconductor region 105 making up PN junction capacitance. Further, the second holding unit 12 is configured to include the portion 104a of the control electrode 104 disposed on the N-type semiconductor region 105 via the insulating film. An inversion layer may be formed on the interface 300 side of the N-type semiconductor region 105 by voltage to be applied to the control electrode 104. Thus, mixing of dark current into the second holding unit 12 may be reduced.

The control electrode 106 is disposed on the third channel 306 via the insulating film 300b. The third charge transfer unit 13 is configured to include the third channel 306 and the control electrode 106 disposed on the third channel 306 via the insulating film.

A plug which is not illustrated is connected to the FD area 107 and OFD area 112. The FD area 107 is connected to the gate electrode of the amplifier transistor via the plug. The OFD area 112 is connected to a wiring 16 which is not illustrated, via the plug. The plug is configured of metal such as tungsten or the like.

Also, the P-type semiconductor region 114 is disposed below the N-type semiconductor region 103. The P-type semiconductor region 114 may be disposed below a portion of the N-type semiconductor region 103, or may be disposed below the whole of the N-type semiconductor region 103. The N-type semiconductor region 103 and P-type semiconductor region 114 make up a PN junction. The impurity concentration of the P-type semiconductor region 114 is higher than the impurity concentration of the P-type semiconductor region disposed below the P-type semiconductor region 114. For example, with some embodiments, the impurity concentration of the P-type semiconductor region 114 is higher than the impurity concentration of the P-type semiconductor region 302. According to such a configuration, extension of the depletion layer from the N-type semiconductor region 103 may be reduced, and accordingly, charge may be transferred from the first holding unit 10 with low voltage.

Also, the P-type semiconductor region 115 is disposed below the N-type semiconductor region 105. The P-type semiconductor region 115 may be disposed just below a portion of the N-type semiconductor region 105, or may be disposed below the whole of the N-type semiconductor region 105. The N-type semiconductor region 105 and P-type semiconductor region 115 make up a PN junction. The impurity concentration of the P-type semiconductor region 115 is higher than the impurity concentration of the P-type semiconductor region disposed below the P-type semiconductor region 115. For example, with some embodiments, the impurity concentration of the P-type semiconductor region 115 is higher than the impurity concentration of the P-type semiconductor region 302. According to such a configuration, extension of the depletion layer from the N-type semiconductor region 105 may be reduced, and accordingly, charge may be transferred from the second holding unit 12 with low voltage.

Note that either or both of the P-type semiconductor regions 114 and 115 may be omitted. With an example of the P-type semiconductor region 114 being omitted, the P-type semiconductor region 302 disposed below the N-type semiconductor region 103 may have an impurity distribution where the impurity concentration becomes higher the deeper the depth is, or an even impurity distribution.

Next, the impurity concentration of each of the semiconductor regions will be described. Note that the impurity concentration of each of the semiconductor regions is not restricted to this, and may be changed as appropriate.

It is desirable that the impurity concentration of the N-type semiconductor region 103 and the impurity concentration of the N-type semiconductor region 105 are each higher than the impurity concentration of the N-type semiconductor region 101. Thus, the charge holding capacitance of the first holding unit 10 and the charge holding capacitance of the second holding unit 12 may be increased. Alternatively, the sensitivity of the photoelectric conversion 8 may be improved.

It is desirable that the impurity concentration of the P-type semiconductor region 303 is higher than that of the P-type semiconductor region 302. Alternatively, it is desirable that the impurity concentration of the P-type semiconductor region 303 is higher than that of the N-type semiconductor region 101. According to such a configuration, noise due to dark current at the photoelectric conversion unit 8 may be reduced.

A light shielding member 113 is disposed above the first holding unit 10 and second holding unit 12. The first holding unit 10 and second holding unit 12 are shielded by the light shielding member 113. Preferably, the light shielding member 113 shields the entire light to be input to the first holding unit 10 and second holding unit 12. The end portion on the photoelectric conversion unit 8 side of the light shielding member 113 is closer to the photoelectric conversion unit 8 than the end portion on the photoelectric conversion unit 8 side of the first holding unit 10. The end portion on the FD area 107 side of the light shielding member 113 is closer to the FD area 107 than the end portion on the FD area 107 side of the second holding unit 12.

However, the configuration is not restricted to this, and an arrangement may be made wherein in the event that the control electrode 102 is shared by the first charge transfer unit 9 and first holding unit 10, at least the end portion of the photoelectric conversion unit 8 side of the control electrode 102 is not covered. According to such a configuration, influence of the light shielding member 113 as to the photoelectric conversion unit 8 is reduced, and accordingly, the sensitivity of the photoelectric conversion unit 8 may be improved. Further, influence as to a pixel position of light to be input with a certain angle against the vertical direction may be reduced. Alternatively, electrons subjected to photoelectric conversion at the N-type semiconductor region 103 or P-type semiconductor region 302 which makes up the first holding unit 10 may be accumulated at the N-type semiconductor region 103. Thus, the sensitivity of pixels may be improved.

Note that the overall of the first holding unit 10 does not have to be covered with the light shielding member 113. For example, in order to dispose a conductor for supplying a driving pulse to the control electrode 102 which makes up the first holding unit 10, an opening may be provided to the light shielding member 113.

The overall of the second holding unit 12 does not have to be covered with the light shielding member 113. For example, in order to dispose a conductor for supplying a driving pulse to the control electrode 104 which makes up the second holding unit 12, an opening may be provided to the light shielding member 113.

Metal making up a wiring layer may be employed as the light shielding member 113. Alternatively, there may be employed metal making up a plug for electrically connecting different wiring layers or between a wiring and a semiconductor region. It is desirable to dispose the light shielding member 113 in a place closer to the semiconductor substrate 300a as much as possible. It is desirable to employ metal making up a wiring layer disposed closest to the semiconductor substrate 300a of the multiple wiring layers, or a metal plug which electrically connects the wiring layer of the lowest layer and a semiconductor region. Alternatively, a metal specifically for the light shielding member 113 may be disposed between the wiring layer of the lowest layer and the semiconductor substrate.

FIGS. 4A and 4B illustrate the light shielding member 113 alone disposed on the first holding unit 10. However, a light shielding member may be disposed on a transistor making up another pixel circuit. Alternatively, a transistor making up another pixel circuit may be shielded by wiring. Transistors making up another pixel circuit include the above-mentioned rest transistor, selecting transistor, amplifier transistor, and so forth.

Figure 5:
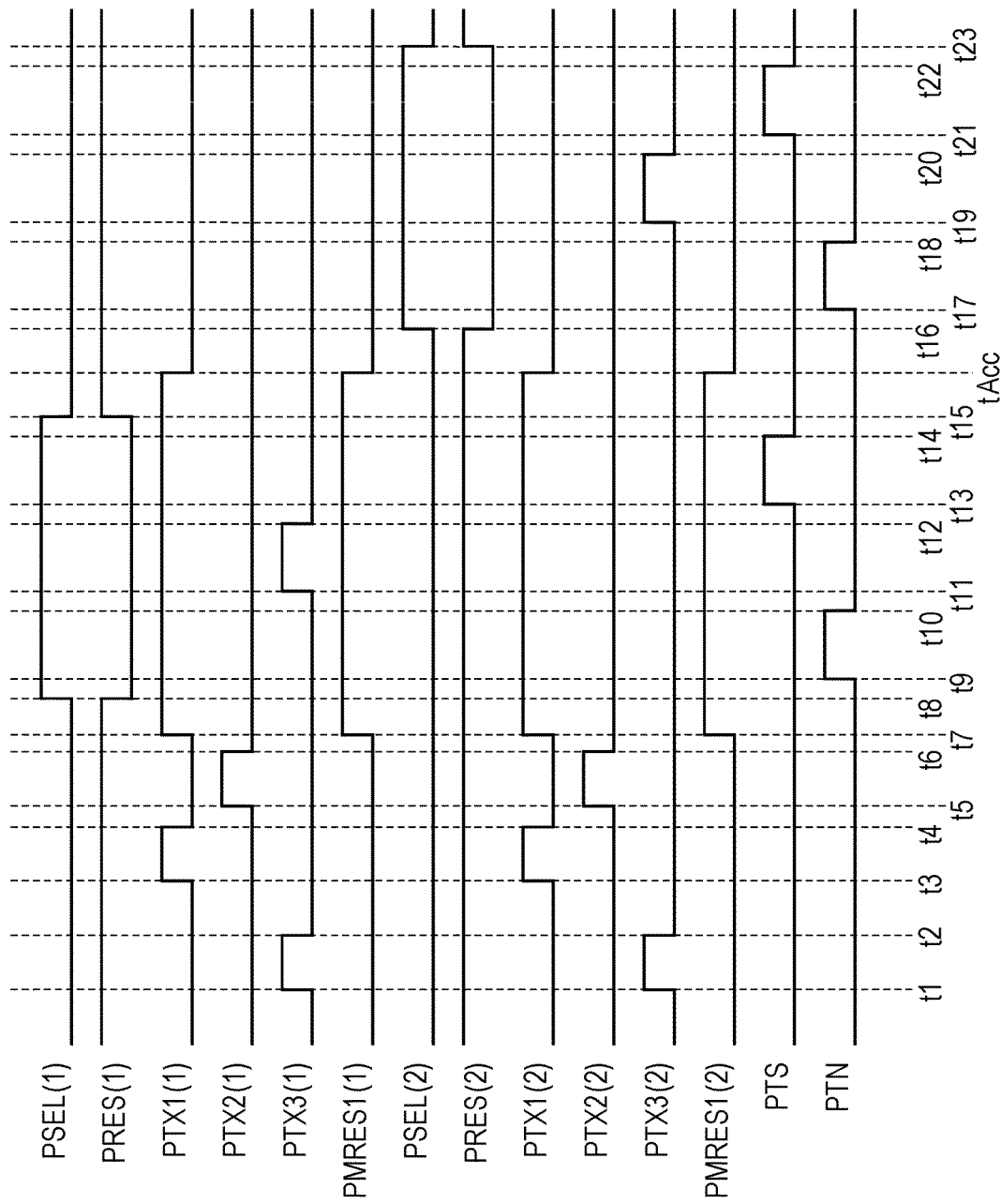
FIG. 5 is a diagram illustrating driving pulses of an embodiment of the image pickup apparatus.

Next, a driving method according to some embodiments will be described. FIG. 5 illustrates a driving pulse diagram of the image pickup apparatus according to some embodiments. This is a pulse diagram illustrating a case of performing global electronic shutter operation wherein exposure periods agree regarding all of the pixels disposed in the image pickup area 2. The numbers in parentheses indicate the number of rows, and in the present drawing, driving pulses to be supplied to the pixels in the first and second rows are illustrated. PSEL indicates a driving pulse to be supplied to the gate of the selecting transistor. PRES indicates a driving pulse to be supplied to the gate of the reset transistor. PTX1 indicates a driving pulse to be supplied to the first control gate. PTX2 indicates a driving pulse to be supplied to the second control gate. PTX3 indicates a driving pulse to be supplied to the third control gate. PMRES1 indicates a driving pulse to be supplied to the fourth control gate. PTS indicates a driving pulse for performing sample hold of a light signal using, for example, the memory unit disposed in the column circuit. PTN indicates a driving pulse for performing sample hold of a noise signal using, for example, the memory unit disposed in the column circuits. All of the driving pulses are in a high level at the time of a conductive state.

At point-in-time t1 and theretofore, the PRES in all of the rows in the image pickup area 2 are in a high level. Therefore, voltage at the input node of the amplifier unit 15 is reset. Here, the other pulses illustrated in FIG. 5 are all in a low level. Thus, electrons generated by photoelectric conversion are accumulated at the photoelectric conversion unit 8 and first holding unit 10. That is to say, the exposure period has started prior to the point-in-time t1. Of electrons generated at the photoelectric conversion unit 8, predetermined amount of electrons move to the first holding unit 10.

At the point-in-time t1, in a state in which the PRES maintains a high level, with all of the pixels disposed in the image pickup area 2, the PTX3 makes the transition from a low level to a high level. Thus, the second holding unit 12 is reset. That is to say, the charge of the second holding unit 12 is discharged via the reset unit 17. At point-in-time t2, with all of the pixels disposed in the image pickup area 2, the PTX3 makes the transition from a high level to a low level. Thus, reset of the second holding unit 12 is completed.

After elapsing of a predetermined period following the point-in-time t2, at point-in-time t3 the PTX1 in all of the rows in the image pickup area 2 makes the transition from a low level to a high level, at point-in-time t4 the PTX1 in all of the rows in the image pickup area 2 makes the transition from a high level to a low level. According to this operation, the electrons remaining in the photoelectric conversion unit 8 are transferred to the first holding unit 10. According to this operation, the exposure periods are ended.

At point-in-time t5, the PTX2 in all of the rows disposed in the image pickup area 2 make the transition from a low level to a high level, and at point-in-time t6 the PTX2 in all of the rows disposed in the image pickup area 2 make the transition from a high level to a low level. According to this operation, the electrons held at the first holding units 10 are transferred to the second holding unit 12.

At point-in-time t7, the PTX1 and PMRES1 in all of the rows disposed in the image pickup area 2 makes the transition from a low level to a high level. Thus, electrons generated at the photoelectric conversion unit 8 are moved to the first holding unit 10, and the electrons of the first holding unit 10 are discharged to the OFD area 112. That is to say, the electrons generated by photoelectric conversion are not accumulated but discharged. In this manner, with some embodiments, when the first charge transfer unit 9 and first charge discharging unit 7 are in a conductive state, this is a shutter period.

At point-in-time t8, the PSEL(1) makes the transition from a low level to a high level. According to this operation, the signals of the pixels at the first row are placed a state enabled to be output to the vertical signal line 20. Further, at the point-in-time t8, the PRES(1) makes the transition from a high level to a low level. Thus, the reset operations of the input nodes 14 of the amplifier elements 15 are completed.

At point-in-time t9, the PTN makes the transition from a low level to a high level, and point-in-time t10 the PTN makes the transition from a high level to a low level. According to this operation, a noise signal is held at, for example, the memory unit for noise signals disposed in the column circuit.

At point-in-time t11, the PTX3(1) makes the transition from a low level to a high level, and at point-in-time t12 the PTX3(1) makes the transition from a high level to a low level. According to this operation, electrons held at the second holding units 12 of the pixels at the first row are transferred to the input nodes 14 of the amplifier elements 15.

At point-in-time t13, the PTS makes the transition from a low level to a high level, and at point-in-time t14 the PTS makes the transition from a high level to a low level. According to this operation, a light signal on which a noise signal is superimposed is held at, for example, the memory unit for light signals disposed in the column circuit.

At point-in-time t15, the PSEL(1) makes the transition from a high level to a low level. According to this operation, the readout periods of the signals of the pixels at the first row are ended. The readout periods of the pixels at the first row are a period from the point-in-time t8 to the point-in-time t15. Further, at the point-in-time t15, the PRES(1) makes the transition from a low level to a high level. Thus, reset for the input nodes 14 of the amplifier elements 15 of the pixels of the first row is started.

After this, with a period from point-in-time t16 to point-in-time t23, readout of the signals of the pixels at the second row are performed. This operation is the same operation as the first row, and accordingly, detailed description will be omitted. The operation at each point-in-time from the point-in-time t16 to the point-in-time t23 is the same as the operation at each point-in-time from the point-in-time t8 to the point-in-time t15 except that objects for driving pulses to be set to a high level belong to the second row.

Here, at point-in-time tAcc between the point-in-time t15 and the point-in-time t16, the PTX1 and PMRES1 in all of the rows disposed in the image pickup apparatus make the transition from a high level to a low level. Thus, electrons generated by photoelectric conversion are accumulated at the photoelectric conversion unit 8 and first holding unit 10. That is to say, the exposure period starts.

With some embodiments, until the exposure period starts at the point-in-time tAcc, the PMRES1 is in a high level. That is to say, before the exposure period starts, the charge of the first holding unit 10 may be discharged to the OFD area 112. Preferably, all of the electrons of the first holding units 10 are discharged before the exposure period starts. Accordingly, when starting accumulation of electrons at the first holding units 10, the electrons remaining at the first holding units 10 may be reduced or may completely be discarded.

In other words, after charge is transferred from the first holding unit 10 to the second holding unit 12 at the point-in-time t6, the charge held at the first holding units 10 is discharged during a period from the point-in-time t7 to the point-in-time tAcc. At the point-in-time tAcc and thereafter, until charge is transferred from the first holding unit 10 to the second holding unit 12 next, the charge held at the first holding unit 10 is not discharged. That is to say, part of the charge held at the first holding units 10 is discharged between transfer of charge and transfer of charge.

Also, at the point-in-time tAcc, the second holding units 12 of the pixels at the second low hold electrons. With some embodiments, the first charge discharging unit 7 which discharges the electrons of the first holding unit 10 is disposed, whereby the electrons of the first holding unit 10 may be discharged when the second holding unit 12 holds electrons.

Note that FIG. 5 illustrates an example for staring an exposure period at between the point-in-time t15 and point-in-time t16. However, the point-in-time tAcc to start an exposure period is not restricted to this. The point-in-time tAcc to start an exposure period may be any time as long as the point-in-time is after the point-in-time t6 when the electrons of the first holding unit 10 are transferred.

According to such an operation, the exposure periods may be equalized at all of the pixels disposed in the image pickup area 2. With the present operation, up to transfer of the first holding unit 10 is performed at the entire image pickup surface at the same time. Specific point-in-time thereof is the point-in-time t6. Thereafter, readout of all of the rows at the image pickup area 2 is performed by repeating the readout operation.

Next, potentials at the pixels according to some embodiments will be described. FIGS. 6 to 8 illustrate a relation of height of a potential barrier at each of the periods in the driving pulse diagram illustrated in FIG. 5. FIGS. 6 to 8 illustrate the potentials of the OFD area 112, first charge discharging unit 7, photoelectric conversion unit 8, first charge transfer unit 9, first holding unit 10, second charge transfer unit 11, second holding unit 12, third charge transfer unit 13, and input node 14 (FD area 107). The potentials of pixels according to some embodiments are illustrated with a solid line.

Note that, with the present Specification, the potential is the potential energy of signal charge. For example, in the event that signal charge is electrons, the higher the voltage applied to a control electrode is, the lower the potential of the semiconductor region below the control electrode becomes. This is because electrons have negative charge. At an area where voltage is high, the potential energy of electrons is low. On the other hand, in the event that signal charge is a hole, the higher the voltage applied to a control electrode is, the higher the potential of the semiconductor region below the control electrode becomes. This is because holes have positive charge. At an area where voltage is high, the potential energy of a hole is high. In FIGS. 6A to 8C, the lower portions in the drawings represent low potential for signal charge, and the upper portions in the drawings represent high potential for signal charge.

Figure 6A:
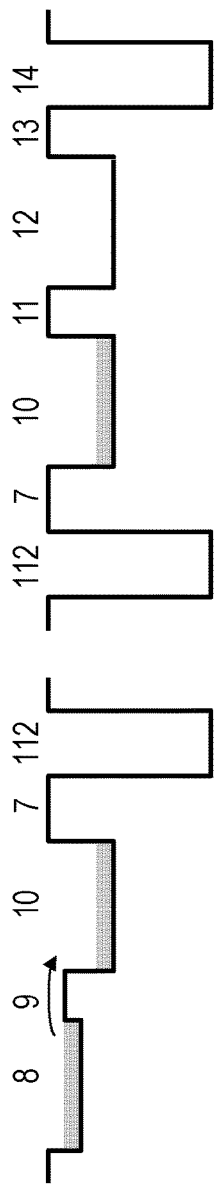
FIGS. 6A to 6D are diagrams representing potential with an embodiment of the image pickup apparatus.

FIG. 6A is a diagram illustrating a potential state before the point-in-time t1. The first charge transfer unit 9, second charge transfer unit 11, third charge transfer unit 13, and first charge discharging unit 7 are in a non-conductive state. That is to say, a potential barrier to be generated at the first charge transfer unit 9 and first charge discharging unit 7 is high. At this time, it is desirable that the potential of the first charge discharging unit 7 is higher than the potential of the first charge transfer unit 9. Also, when the first charge transfer unit 9 and first charge discharging unit 7 are in a non-conductive state, it is desirable that the potential of the first holding unit 10 is lower than the potential of the photoelectric conversion unit 8. Thus, the charge generated by photoelectric conversion is held at the photoelectric conversion unit 8 and first holding unit 10.

Note that, in the event that the potential of the first charge transfer unit 9 is higher than the potential of the photoelectric conversion unit 8, little amount of electrons are accumulated in the photoelectric conversion units 8 alone. In this case, in the event that a certain amount or more of electrons are generated at the photoelectric conversion units 8, the electrons of the first holding unit 10 crosses over a potential barrier generated at the first charge transfer unit 9 and moves. Specifically, in the event that predetermined amount or more light has been input, electrons are held at the photoelectric conversion units 8 and first holding units 10 during an exposure period.

Figure 6B:
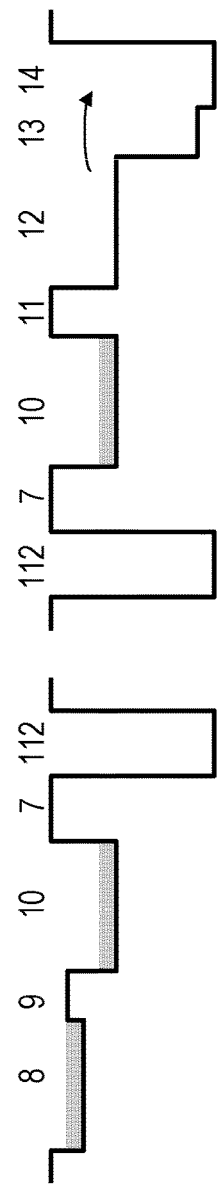

FIG. 6B is a diagram illustrating a potential state during a period from the point-in-time t1 to the point-in-time t2. As described in FIG. 5, with the period from the point-in-time t1 to the point-in-time t2, a pulse in a high level is supplied to the third charge transfer unit 13. That is to say, a potential barrier generated at the third charge transfer unit 13 is in a low state. Thus, the electrons of the second holding unit 12 are discharged to the drain (not illustrated) of the reset transistor. Preferably, no electrons exist in the second holding unit 12.

At this time, it is a desirable state that the potentials decrease in order from the second holding unit 12 to the input node 14 of the amplifier unit 15. Specifically, the potential of the second holding unit 12 may be higher than the potential of the third charge transfer unit 13, and the potential of the third charge transfer unit 13 may be higher than the potential of the input node 14.

Figure 6C:
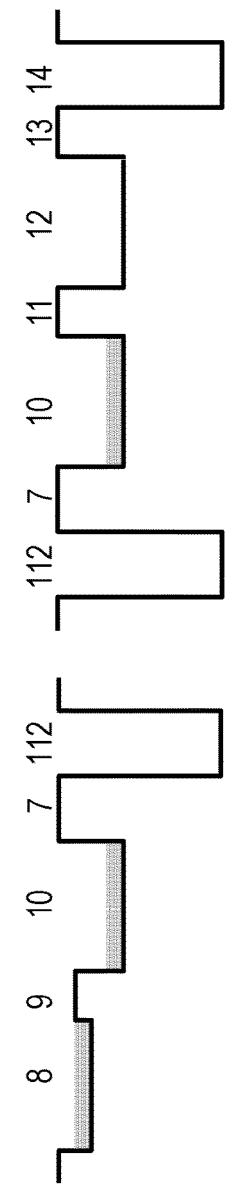

FIG. 6C is a diagram illustrating a potential state during a period from the point-in-time t2 to the point-in-time t3. The third charge transfer unit 13 is in a non-conductive state, and accordingly, the potential barrier at the third charge transfer unit 13 becomes high. This state is the same as with FIG. 6A.

Figure 6D:
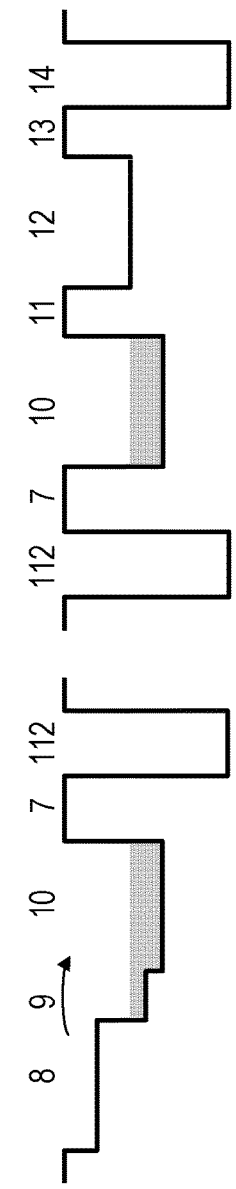

FIG. 6D is a diagram illustrating a potential state during a period from the point-in-time t3 to the point-in-time t4. At this time, the first charge transfer unit 9 is in a conductive state. Thus, electrons accumulated at the photoelectric conversion unit 8 is transferred to the first holding unit 10. In order to improve transfer efficiency of electrons from the photoelectric conversion unit 8, it is desirable that a potential barrier at the time of conduction of the first charge transfer unit 9 is lower than the potential of the photoelectric conversion unit 8. Further, it is desirable that the potential of the first holding unit 10 is lower than the potential of the photoelectric conversion unit 8.

With some embodiments, the control electrode 102 is shared by the first charge transfer unit 9 and first holding unit 10, and accordingly, when a driving pulse to cause the first charge transfer unit 9 to be in a conductive state is supplied, the potential of the first holding unit 10 also decreases. Thus, as illustrated in FIG. 6D, potential in the event that there are no electrons at the first holding unit 10 may be lower than the potential of the second holding unit 12.

Figure 7A:
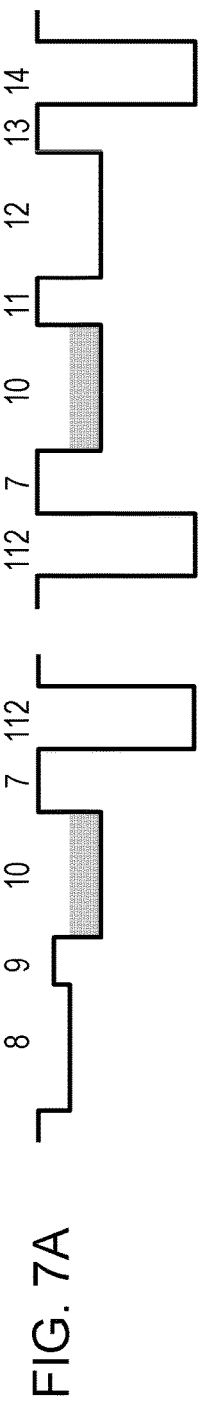
FIGS. 7A to 7D are diagrams representing potential with an embodiment of the image pickup apparatus.

FIG. 7A is a diagram illustrating a potential state during a period from the point-in-time t4 to the point-in-time t5. This illustrates a state after the first charge transfer unit 9 enters a non-conductive state, and also before the second charge transfer unit 11 enters a conductive state. Also, the first charge discharging unit 7 is in a non-conductive state. Therefore, the amount of electrons determined by potential barriers generated at the first charge transfer units 9 and first charge discharging units 7 have been accumulated in the first holding units 10.

Figure 7B:
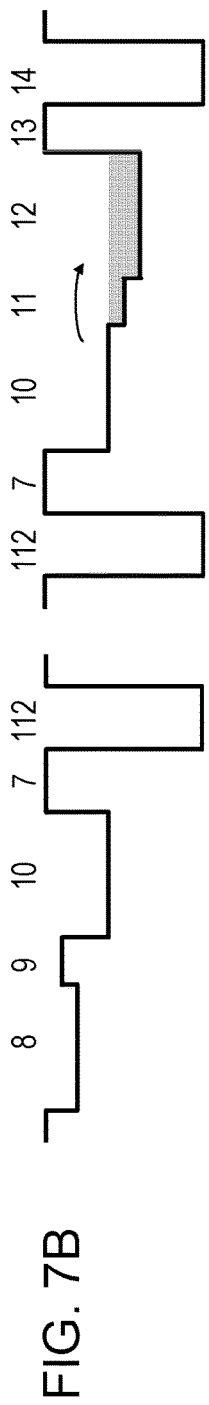

FIG. 7B is a diagram illustrating a potential state during a period from the point-in-time t5 to the point-in-time t6. The second charge transfer unit 11 is in a conductive state. Thus, the electrons held at the first holding unit 10 are transferred to the second holding unit 12 via the second charge transfer unit 11. In order to improve the transfer efficiency of electrons from the first holding unit 10, it is desirable that a potential barrier at the time of conduction of the second charge transfer unit 11 is lower than the potential of the first holding unit 10. Further, it is desirable that the potential of the second holding unit is lower than the potential of the first holding unit 10.

With some embodiments, the control electrode 104 is shared by the second charge transfer unit 11 and second holding unit 12. Therefore, when a driving pulse to cause the second charge transfer unit 11 to be in a conductive state is supplied, the potential of the second charge transfer unit 11 decreases, and accompanied with this, the potential of the second holding unit 12 also decreases. Note that, when all of the charge transfer units and the first charge discharging unit 7 are in a non-conductive state, the potentials of the first holding unit 10 and second holding unit 12 may be the same. Alternatively, at this time, the potential of the first holding unit 10 may be higher than the potential of the second holding unit 12.

Figure 7C:
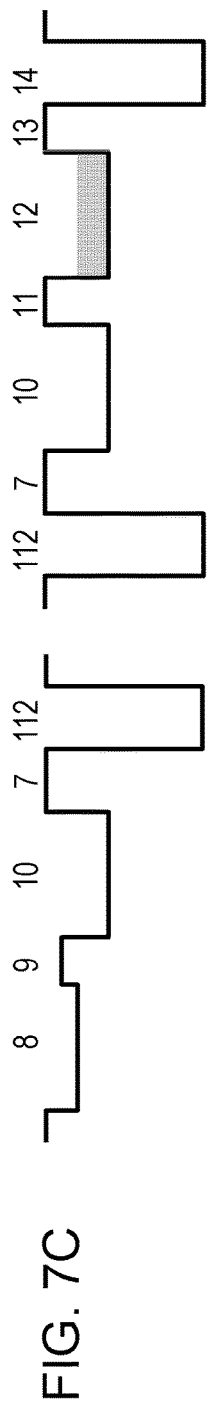

FIG. 7C is a diagram illustrating a potential state during a period from the point-in-time t6 to the point-in-time t7. The second charge transfer unit 11 is in a non-conductive state. Also, the third charge transfer unit 13 is in a non-conductive state. Thus, the second holding unit 12 holds electrons.

Figure 7D:
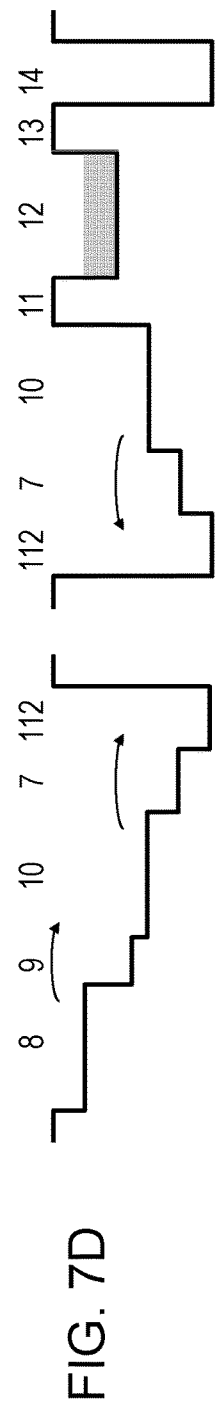

FIG. 7D illustrates potential states of the pixels at the first row during a period from the point-in-time t7 to the point-in-time t11, and potential states of the pixels at the second row during a period from the point-in-time t7 to the point-in-time tAcc. This is a period after the second charge transfer unit 11 enters a non-conductive state until the third charge transfer unit 13 enters a conductive-state. The length of this period may differ for each pixel row. Both of the second charge transfer unit 11 and third charge transfer unit 13 are in a non-conductive state, and the second holding unit 12 accumulates electrons according to these potential barriers.

Also, at the point-in-time t7, the first charge transfer unit 9 and first charge discharging unit 7 enter a conductive state. Thus, electrons generated at the photoelectric conversion unit 8 may be moved to the first holding unit 10, and the electrons of the first holding unit 10 are discharged to the OFD area 112. At this time, it is desirable that a potential barrier at the first charge discharging unit 7 is lower than the potential of the photoelectric conversion unit 8. According to such a potential state, electrons generated at the photoelectric conversion unit 8 may be moved to the OFD area 112. In this manner, when the second holding unit 12 holds electrons, the charge of the first holding unit 10 is discharged to the OFD area 112. That is to say, the first holding unit 10 may be reset.

Figure 8A:
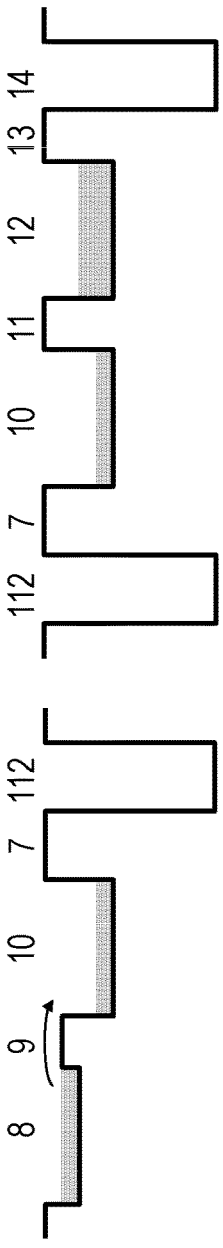
FIGS. 8A to 8C are diagrams representing potential with an embodiment of the image pickup apparatus.

FIG. 8A illustrates potential states of the pixels at the second row during a period from the point-in-time tAcc to the point-in-time t19. Specifically, this indicates a state in which when the second holding unit 12 holds electrons, an accumulation period starts. The first charge transfer unit 9 and first charge discharging unit 7 enter a non-conductive state. Therefore, electrons generated at the photoelectric conversion unit 8 are accumulated at the photoelectric conversion unit 8 and first holding unit 10.

Figure 8B:
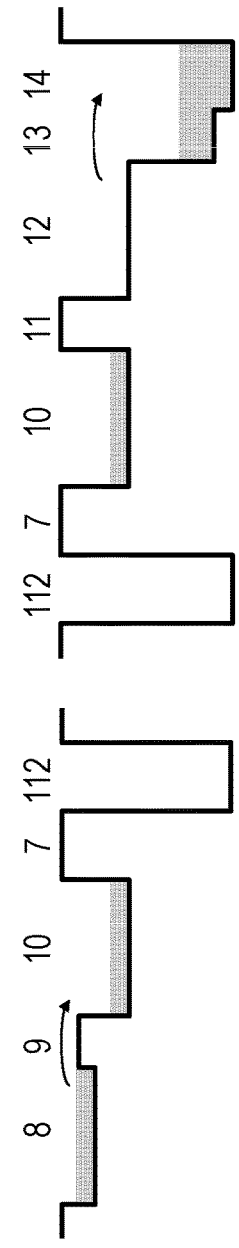

FIG. 8B illustrates potential states of the pixels at the second row during a period from the point-in-time t19 to the point-in-time t20. The third charge transfer unit 13 enters a conductive state. Thus, electrons held at the second holding unit 12 is transferred to the input node 14 of the amplifier unit 15. In order to improve the transfer efficiency of electrons from the second holding unit 12, it is desirable that the height of a potential barrier at the time of conduction of the third charge transfer unit 13 is lower than the height of potential of the second holding unit 12. Further, it is desirable that the height of potential of the input node 14 of the amplifier unit 15 is lower than the height of potential of the second holding unit 12.

Figure 8C:
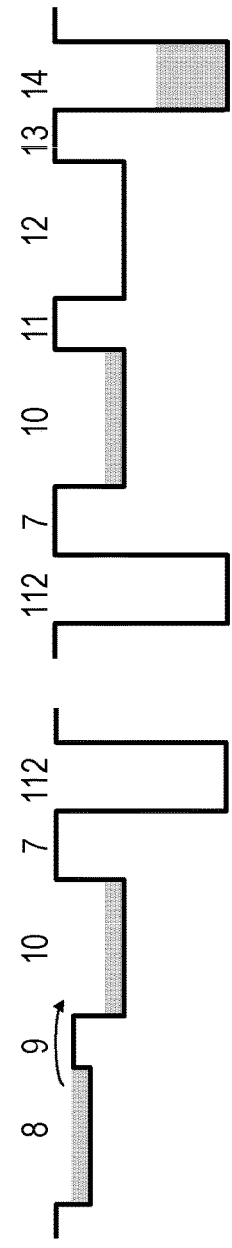

FIG. 8C illustrates potential states of the pixels at the second row during a period from the point-in-time t20 to the point-in-time t23. This is a diagram illustrating potential states after the third charge transfer unit 13 enters a non-conductive state.

Note that, with the potentials of the pixels at the first row during a period from the point-in-time t11 to the point-in-time t12, as illustrated in FIG. 7D, when the first charge transfer unit 9 and first charge discharging unit 7 are in a conductive state, the third charge transfer unit 13 enters a conductive state. Thus, though light is input to the photoelectric conversion unit 8, electrons are discharged from the first charge discharging unit 7 to the OFD area 112. On the other hand, the electrons of the second holding unit 12 are transferred to the input node 14 of the amplifier unit 15. In order to improve the transfer efficiency of electrons from the second holding unit 12, it is desirable that the height of a potential barrier at the time of conduction of the third charge transfer unit 13 is lower than the height of potential of the second holding unit 12. Further, it is desirable that the height of potential of the input node 14 of the amplifier unit 15 is lower than the height of potential of the second holding unit 12.

The potentials of the pixels at the first row during a period from the point-in-time t12 to the point-in-time t15 are in a state in which electrons are held at the input node 14 of the amplifier unit 15 in the potential states illustrated in FIG. 7D. At the point-in-time t15, upon the input nodes 14 of the amplifier units 15 of the pixels at the first row being reset, charge held at the input nodes 14 of the amplifier units 15 are discharged.

With some embodiments, the potential of the first holding unit 10 is lower than the potential of the photoelectric conversion unit 8. As illustrated in FIG. 6A, when the first charge transfer unit 9 is in a non-conductive state, and as illustrated in FIG. 6D, when the first charge transfer unit 9 is in a conductive state, in either case, the potential of the first holding unit 10 is lower than the potential of the photoelectric conversion unit 8. With such a configuration, the electrons of the first holding unit 10 are readily discharged by the first charge discharging unit 7 being connected to the first holding unit 10. This is because the potential of the photoelectric conversion unit 8 is higher, and accordingly, it is difficult to discharge the electrons of the first holding unit 10 via the photoelectric conversion unit 8.

With some embodiments, the first charge discharging unit 7 may be connected to the photoelectric conversion unit 8. In this case, when the first charge transfer unit 9 is in a conductive state, the potential of the first holding unit 10 becomes higher than the potential of the photoelectric conversion unit 8, and accordingly, the charge of the first holding unit 10 may be discharged. Such a potential state may be formed with a relation between the impurity concentration of a semiconductor region which makes up the first holding unit 10 and the impurity concentration of a semiconductor region which makes up the photoelectric conversion unit 8. Alternatively, the above-mentioned potential state may be formed by voltage to be applied to the control electrode of the first holding unit 10. It is desirable that the control electrode of the first charge transfer unit 9 and the control electrode of the first holding unit 10 is electrically separated. Thus, the potential of the first charge transfer unit 9 and the potential of the first holding unit 10 may independently be controlled. Therefore, it is easy to increase the potential of the first holding unit 10 as compared to the photoelectric conversion unit 8.

Also, with some embodiments, as illustrated in FIG. 7B, when the second charge transfer unit 11 is in a conductive state, the potential of the second holding unit 12 is lower than the potential of the first holding unit 10. According to such a potential state, transfer of charge from the first holding unit 10 to the second holding unit 12 may effectively be performed. Alternatively, according to such a potential state, complete depletion transfer from the first holding unit 10 to the second holding unit 12 is enabled. The complete depletion transfer is that charge is transferred by the entirety of the N-type semiconductor region 103 which makes up the first holding unit 10 being depleted.

With a configuration wherein when the second charge transfer unit 11 is in a conductive state, the potential of the second holding unit 12 is lower than the potential of the first holding unit 10, it is desirable to connect a reset unit to the input nodes 14 of the amplifier units 15. Thus, the electrons of the second holding unit 12 may be discharged via the input node 14 of the amplifier 15. That is to say, the second holding unit 12 may be reset via the input node 14 of the amplifier unit 15. This is because the potential of the first holding unit 10 is higher, and accordingly, it is difficult to discharge the electrons of the second holding unit 12 via the first holding unit 10.

Also, with the second holding unit 12, a period to hold electrons may differ depending on rows. Therefore, when noise caused at the second holding unit 12 is great, this causes shading, and accordingly, the image quality may deteriorate. On the other hand, noise caused at the second holding unit 12 may be reduced by reducing the number of channels to be connected to the second holding unit 12. The channels are charge transfer paths of which the potentials are controlled. Specifically, it is desirable that the number of channels to be connected to the second holding unit 12 is two. One is a charge transfer path from the first holding unit 10 to the second holding unit 12. The other is a charge transfer path from the second holding unit 12 to the input node 14. Note that there may be another path where charge overflowing from the second holding unit 12 moves.

As described above, with some embodiments, the charge of the first holding unit 10 may be discharged. According to such a configuration, the image quality of an image pickup apparatus may be improved.

Second Embodiment

Another embodiment of the image pickup apparatus according to the present technology will be described. The present embodiment differs from the first embodiment in that the present embodiment includes a second charge discharging unit 29 which is connected to the photoelectric conversion unit 8. Therefore, with the present embodiment, only points different from the first embodiment will be described, and description will be omitted regarding the other portions.

The overall block configuration of the image pickup apparatus according to the present embodiment is the same as with the first embodiment. Specifically, FIG. 1 is an overall block diagram of the image pickup apparatus according to the present embodiment.

Figure 9:
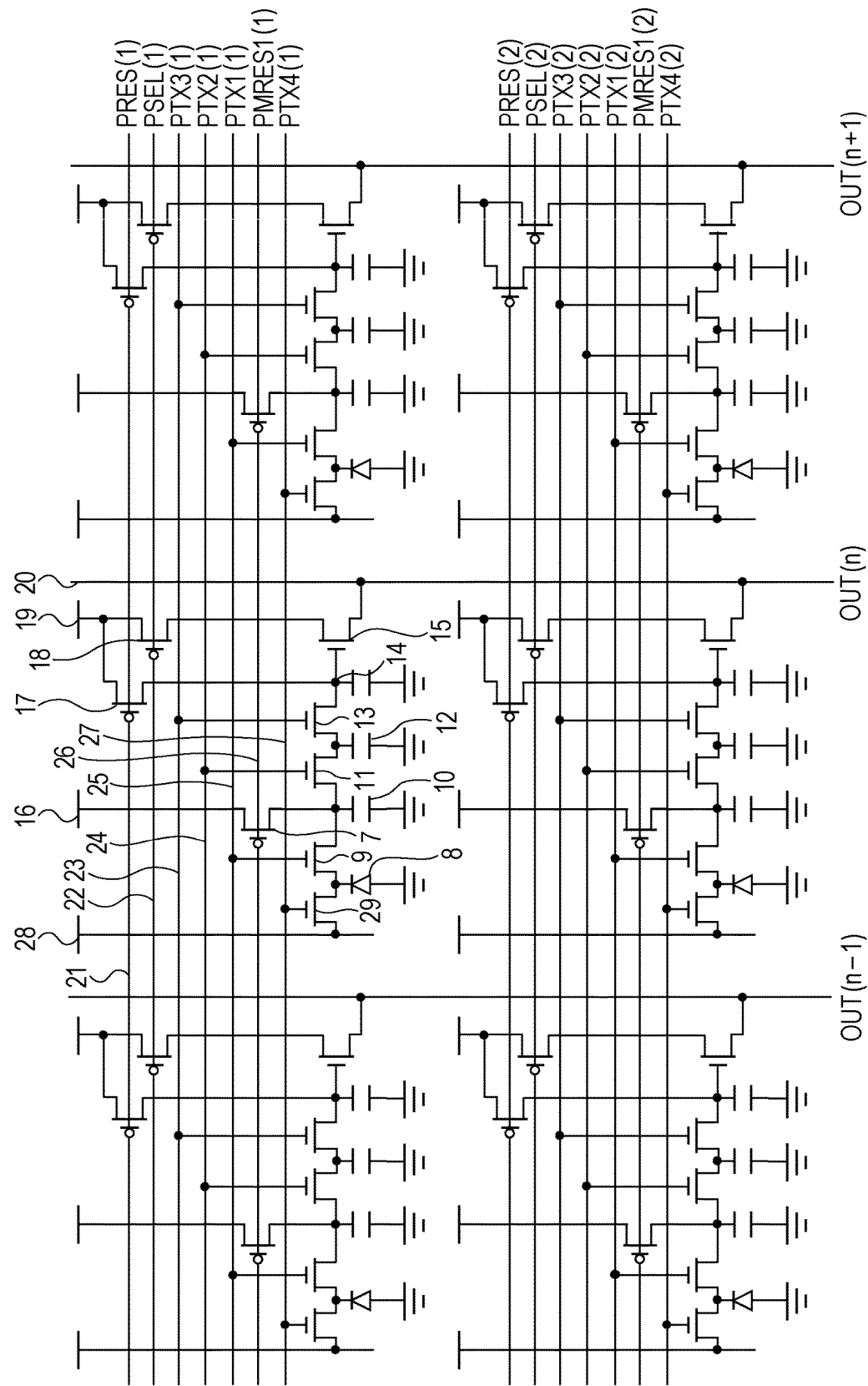
FIG. 9 is a diagram illustrating an equivalent circuit of an embodiment of the image pickup apparatus.

FIG. 9 illustrates an equivalent circuit of the image pickup apparatus according to the first embodiment. Portions having the same functions as with FIG. 2 are denoted with the same reference numerals as with FIG. 2, and accordingly, detailed description will be omitted. Here, though 6 pixels in a total of two rows by three columns are illustrated, an image pickup area may be configured by an even greater number of pixels being disposed.

With some embodiments, pixels include the second charge discharging unit 29. The second charge discharging unit 29 transfers electrons from the photoelectric conversion unit 8 to a second OFD area. The second OFD area is a charge discharging node that discharges charges. The second OFD area may include, for example, an N-type semiconductor region that is connected electrically to a wiring 28 which supplies power supply voltage. The second charge discharging unit 29 may be configured to include a control electrode disposed on the semiconductor substrate via the insulating film. With some embodiments, electronic shutter operation may be performed with the second charge discharging unit 29. That is to say, a period to discharge electrons generated at the photoelectric conversion unit 8 (shutter period) and a period to accumulate electrons (exposure period) may be controlled by controlling the second charge discharging unit 29.

A fifth transfer control wiring 27 supplies a driving pulse PTX4 to a control electrode that configures the second charge discharging unit 29 (hereinafter, fifth control gate). The height of the potential barrier of the semiconductor region below the fifth control gate may be changed by changing a pulse value to be supplied to the fifth control gate. That is to say, the charge transfer path disposed under the control electrode may be controlled by the second charge discharging unit 29. With some embodiments, portions of other pixels are the same as with the first embodiment.

With some embodiments, the pixel configuration illustrated with the equivalent circuit exemplified in FIG. 9, the electrical path between the photoelectric conversion unit 8 and the first holding unit 10 may have the following configuration. The configuration thereof is a configuration wherein the first charge transfer unit 9 disposed in the electrical path between the photoelectric conversion unit 8 and the first holding unit 10 is in a non-conductive state, and electrons are allowed to be moved from the photoelectric conversion unit 8 to the first holding unit 10. Here, the non-conductive state is a state in which of pulse values to be supplied to the first charge transfer unit 9, a pulse value to generate the highest potential barrier has been supplied. Accordingly, the first charge transfer unit 9 does not have to be so-called completely off, and the non-conductive state of the first charge transfer unit 9 also includes a state in which some sort of potential barrier has occurred as compared to a case where the first charge transfer unit 9 has completely been turned on.

For example, in the event that a MOS transistor is used as the first charge transfer unit 9, a specific configuration may be made by this MOS transistor having an embedded channel configuration. More generally speaking, this configuration is a configuration wherein there is a portion in an area deeper than the surface where the potential barrier for electrons is lower than the surface when the first charge transfer unit 9 is in a non-conductive state. In this case, a driving pulse to be supplied to the first charge transfer unit 9 may be a fixed value. That is to say, s fixed potential barrier may be employed instead of a configuration wherein two states of a conductive state and a non-conductive state are switchable.

According to such a configuration, when light is input to the photoelectric conversion unit 8, most of the electrons generated by photoelectric conversion are moved to the first holding unit 10 during the exposure period. Accordingly, the accumulation periods of all of the pixels disposed in the image pickup area 2 may be aligned.

Further, when the first charge transfer unit 9 is in a non-conductive state, a hole is accumulated on the surface. Also, the channel where electrons move exists in a predetermined depth portion from the surface, and accordingly, influence of dark current may be reduced as compared to a case where electrons move in an interface between the semiconductor substrate and the insulating film.

Alternatively, the electrical path between the photoelectric conversion unit 8 and the first holding unit 10 may have another configuration. The other configuration is a configuration wherein the first charge transfer unit 9 disposed in the electrical path between the photoelectric conversion unit 8 and the first holding unit 10 is in a non-conductive state, and no electrons are moved from the photoelectric conversion unit 8 to the first holding unit 10. Here, the non-conductive state is a state in which of pulse values to be supplied to the first charge transfer unit 9, a pulse value to generate the highest potential barrier has been supplied. In other words, this is a configuration wherein the majority of electrons generated by photoelectric conversion are accumulated in the photoelectric conversion unit 8.

During a period for accumulating electrons at the photoelectric conversion unit 8, a lower potential barrier than the potential barrier at the first charge transfer unit 9 is formed, and accordingly, a configuration wherein no electrons are moved from the photoelectric conversion unit 8 to the first holding unit 10 may be obtained. As for a specific configuration, when the first charge transfer unit 9 and the second charge transfer unit 29 are in a non-conductive state, a potential barrier to be formed below the first control gate is higher than a potential barrier to be formed below the fifth control gate. Note that, when the first charge transfer unit 9 and second charge discharging unit 7 are in a non-conductive state, electrons may be accumulated at the photoelectric conversion unit 8.

According to such a configuration, the majority of electrons generated by photoelectric conversion at the time of light being input to the photoelectric conversion unit 8 are transferred to the first holding unit 10 during the exposure period. Accordingly, with all of the pixels disposed in the image pickup area 2, by the transfer of charges accumulated in the photoelectric conversion unit 8 to the first holding unit 10, the accumulation periods of all of the pixels may be aligned.

Specific configurations of pixels of some embodiments will be described with reference to FIGS. 10 and 11. Portions having the same functions as with FIGS. 3 and 4 are denoted with the same reference numerals. The portions denoted with the same reference numerals as with FIGS. 3 and 4 are the same as with the first embodiment, and accordingly, detailed description will be omitted.

Figure 10:
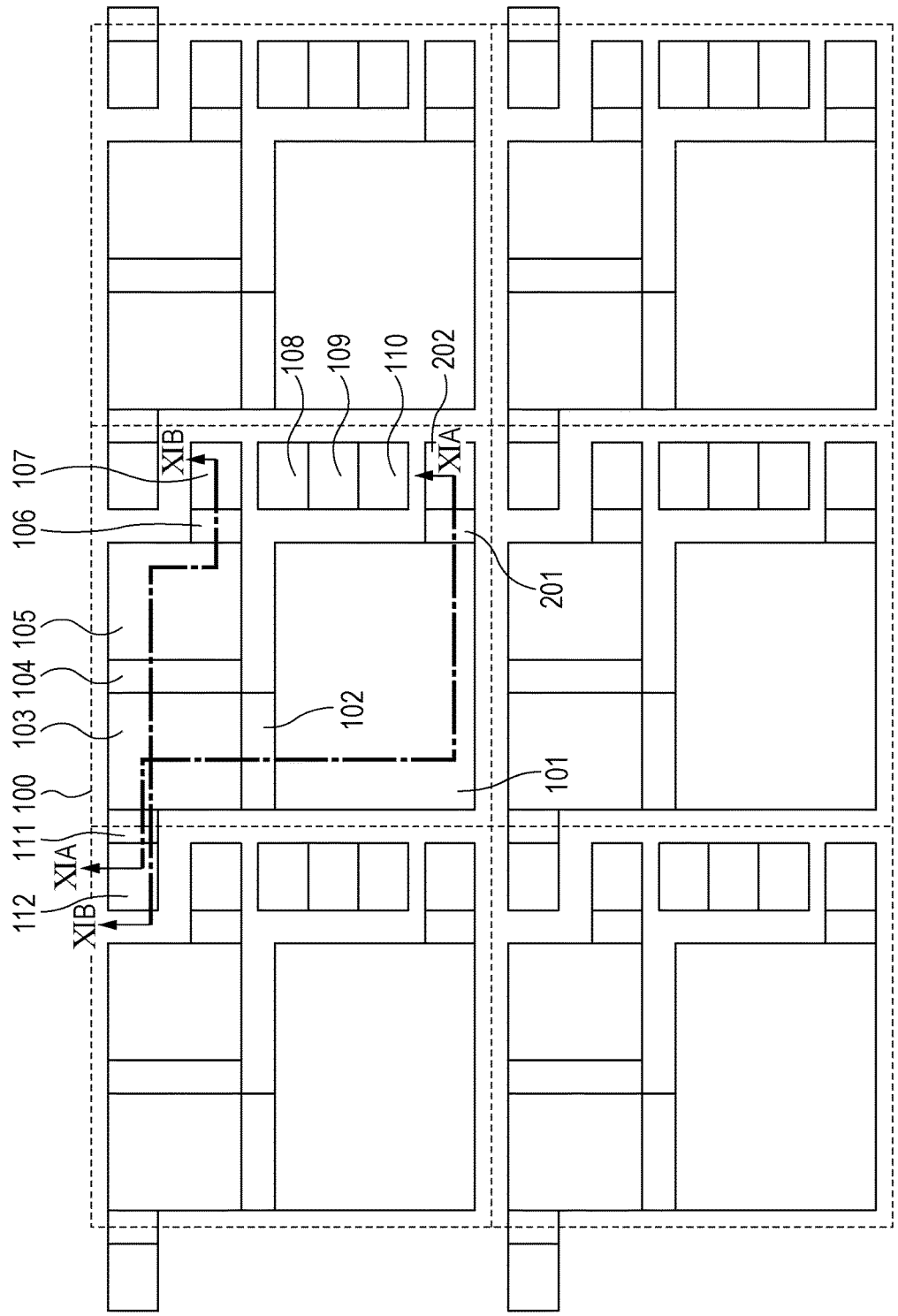
FIG. 10 is a schematic view illustrating the top face of an embodiment of the image pickup apparatus.

FIG. 10 illustrates a top view of image pickup apparatuses according to some embodiments. Here, though six pixels in a total of two rows by three columns are illustrated, an image pickup area may be configured by an even greater of pixels being disposed.

Pixels 100 each include a control electrode 201 which configures the second charge discharging unit 29, and a second OFD area 202. The other portions are the same as with the first embodiment. Further, the second OFD area 202 may be shared with the source or drain of the reset transistor, the selecting transistor, or the amplifier transistor. That is to say, the charge of the photoelectric conversion unit 8 is transferred to the source or drain of one of the reset transistor, the selecting transistor, and the amplifier transistor. According to such a configuration, the area of the photoelectric conversion unit 8 may be increased, and accordingly, sensitivity may be improved.

The second charge discharging unit 29 may be configured with a MOS transistor configured with a control electrode 201, an N-type semiconductor region 101, and a second OFD area 202. The control electrode 201 included in the second charge discharging unit 29 is disposed adjacent to the N-type semiconductor 101 on a parallel line. According to such a configuration, the second charge discharging unit 29 may discharge charges from the photoelectric conversion unit 8.

Figure 11A:
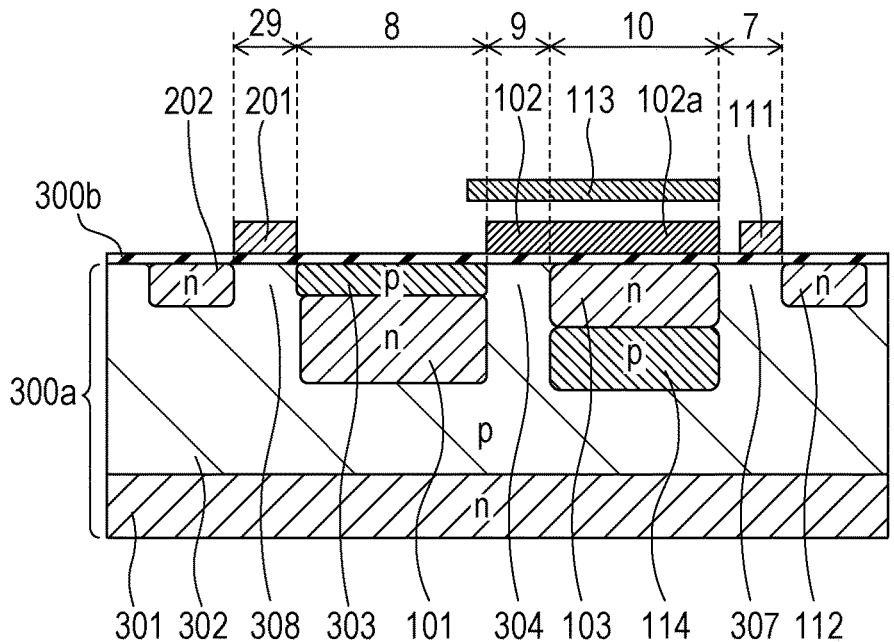
FIGS. 11A and 11B are schematic views of a cross section of an embodiment of the image pickup apparatus.
Figure 11B:
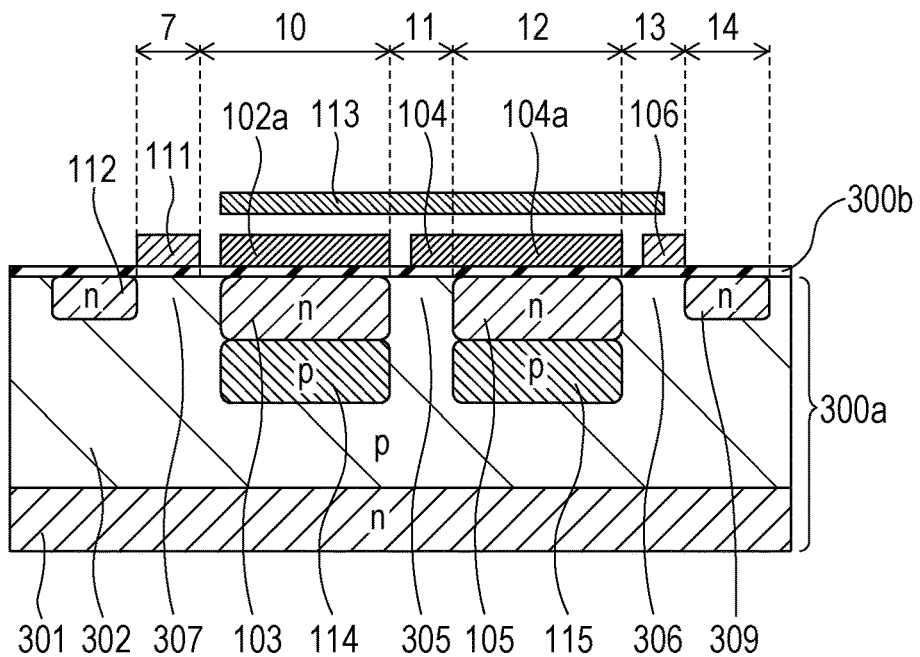

FIG. 11A is a schematic view illustrating a cross section along the line XIA-XIA. The same reference numerals are used for portions having the same functions as in FIG. 4A. FIG. 11B is a schematic view illustrating the cross section along the line XIB-XIB from FIG. 10. FIG. 11B is the same figure as FIG. 4B. That is to say, the cross section along the line XIB-XIB of the embodiment is the same as the cross section long the line IVB-IVB in the first embodiment.

As illustrated in FIG. 11A, with some embodiments, electrons generated at the photoelectric conversion unit 8 have a potential to be discharged in the second OFD area 202 through a channel 308 disposed under the control electrode 201. The second OFD area is connected to a plug not depicted in the diagram. The second OFD area 202 connects to a wiring 28 though the plug. The plug is configured from a metal such as tungsten. Further, other portions of FIG. 11A are the same as in the first embodiment.

Figure 12:
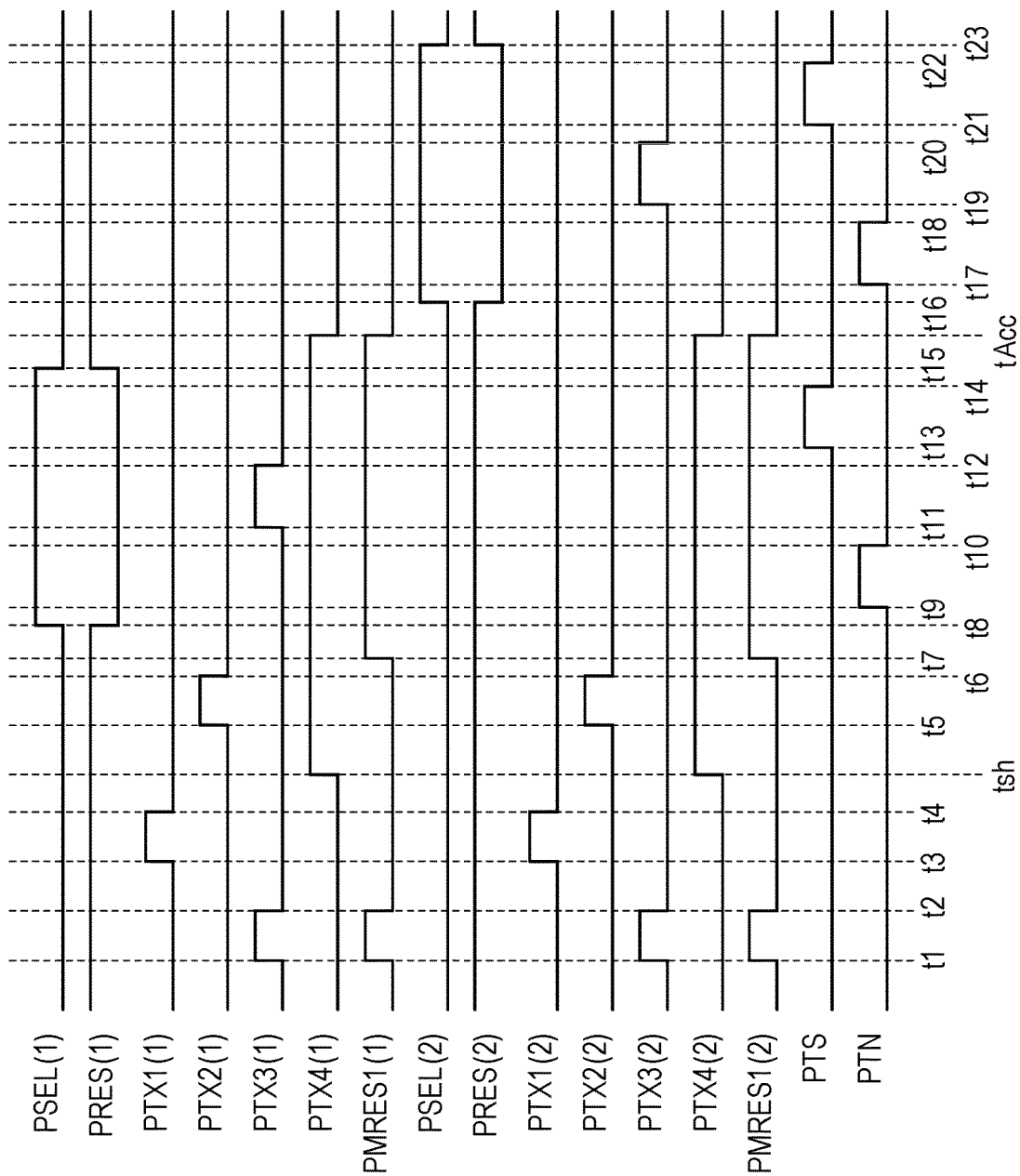
FIG. 12 is a diagram illustrating driving pulses of an embodiment of the image pickup apparatus.

Next, a driving method according to some embodiments will be described. FIG. 12 illustrates a driving pulse diagram of the image pickup apparatus according to some embodiments. This is a pulse diagram illustrating a case of performing global electronic shutter operation wherein exposure periods agree regarding all of the pixels disposed in the image pickup area 2. The numbers in parenthesis indicate the number of rows, and in the present drawing, driving pulses to be supplied to the pixels in the first and second rows are illustrated. PSEL indicates a driving pulse to be supplied to the gate of the selecting transistor. PRES indicates a driving pulse to be supplied to the gate of the reset transistor. PTX1 indicates a driving pulse to be supplied to the first control gate. PTX2 indicates a driving pulse to be supplied to the second control gate. PTX3 indicates a driving pulse to be supplied to the third control gate. PTX4 indicates a driving pulse to be supplied to the fifth control gate.

PMRES1 indicates a driving pulse to be supplied to the fourth control gate. PTS indicates a driving pulse for performing sample hold of a light signal using, for example, the memory unit disposed in the column circuit. PTN indicates a driving pulse for performing sample hold of noise signal using, for example, the memory unit disposed in the column circuits. All of the driving pulses are in a high level at the time of a conductive state.

At point-in-time t1 and theretofore, the PRES in all of the rows in the image pickup area 2 is in a high level. For this reason, the voltage of the input node for amplifier unit 15 is reset. Here, all other pulses depicted in FIG. 5 are in a low level. For this reason, electrons generated by photoelectric conversion at the photoelectric conversion unit 8 are accumulated. That is to say, the exposure period has started before the point-in-time t1. During exposure periods, of electrons generated at the photoelectric conversion unit 8, a predetermined amount of electrons may move to the first holding unit 10. During exposure periods, all charges may be accumulated in the photoelectric conversion unit 8.

At the point-in-time t1, in a state which the PRES maintains a high level, with all of the pixels disposed in the image pickup area 2, the PTX3 makes the transition from a low level to a high level. Thus, the second holding unit 12 is reset. That is to say, the charge in the second holding unit 12 is discharged through a resetting unit 17. At the point-in-time t2, with all of the pixels disposed in the image pickup area 2, the PTX3 makes the transition from a high level to a low level. Thus, the second holding unit 12 is reset.

Also, with some embodiments, at the point-in-time t1, all of the pixels disposed in the image pickup area 2, the PMRES1 makes the transition from a low level to a high level. Thus, the first charge discharging unit 7 becomes conductive, and the electrons in the first holding unit 10 are discharged through the OFD area 112. That is to say, the first holding unit 10 resets. After this, at the point-in-time t2, with all the pixels disposed in the image pickup area 2, PMRES1 makes the transition from a high level to a low level. Thus, the first holding unit is reset. In this way, with some embodiments, before electrons transfer to the first holding unit 10, the first holding unit 10 is reset.

After elapsing of a predetermined period following the point-in-time 2, at point-in-time 3, the PTX1 in all of the rows in the image pickup area 2 makes the transition from a low level to a high level, and at point-in-time t4, the PTX1 in all of the rows in the image pickup area 2 makes the transition from a high level to a low level. According to this operation, the electrons remaining in the photoelectric conversion unit 8 are transferred to the first holding unit 10. According to this operation, the exposure periods are ended.

At a point-in-time tsh, PTX4 makes the transition from a low level to a high level. Thus, the second charge discharging unit 29 changes to a conductive state. For this reason, the electrons generated by photoelectric conversion at the photoelectric conversion unit 8 are discharged through the second OFD area 202. In this way, with some embodiments, the state when the second charge discharging unit 29 is conductive is the shutter period. Further, at the point-in-time tsh, the first holding unit 10 is holding electrons.

At the point-in-time t5, the PTX2 in all of the rows in the image pickup area 2 makes the transition from a low level to a high level, and at the point-in-time t6, the PTX2 in all of the rows in the image pickup area 2 makes the transition from a high level to a low level. According to this operation, the electrons held in the first holding unit 10 are transferred to the second holding unit 12.

At the point-in-time t7, the PMRES1 in all of the rows disposed in the image pickup apparatus makes the transition from a low level to a high level. Thus, the first charge discharging unit 7 is conductive, and so the electrons in the first holding unit 10 are transferred to the OFD area 112. In this way, with some embodiments, during the period from the point-in-time t7 to the point-in-time tAcc, the first charge discharging unit 7 and the second charge discharging unit 29 are both conductive.

At the point-in-time t8, the PSEL (1) makes the transition from a low level to a high level. According to this operation, the signal of the pixel in the first row changes to a state where it may be output by a vertical signal line 20. Further, at the point-in-time t8, the PRES (1) makes the transition from a high level to a low level. Thus, the reset operation of the input node 14 in the amplifier unit 15 completes.

At the point-in-time t9, the PTN makes the transition from a low level to a high level, and at the point-in-time t10, the PTN makes the transition from a high level to a low level. According to this operation, a noise signal is held at, for example, the memory unit for noise signals disposed in the column circuit.

At the point-in-time t11, the PTX3 (1) makes the transition from a low level to a high level, and at the point-in-time t12, the PTX3 (1) makes the transition from a high level to a low level. According to this operation, the electrons held by the second holding unit 12 for the pixel in the first row are transferred to the input node 14 in the amplifier unit 15.

At the point-in-time t13, the PTS makes the transition from a low level to a high level, and at the point-in-time t14, the PTS makes the transition from a high level to a low level. According to this operation, a light signal on which a noise signal is superimposed is held at, for example, the memory unit for light signals disposed in the column circuit.

At the point-in-time t15, the PSEL (1) makes the transition from a high level to a low level. According to this operation, the readout period of the signal for the pixel in the first row ends. The period of the signal for the pixel in the first row is the period from the point-in-time t8 to the point-in-time t15. Further, at the point-in-time t15, the PRES (1) makes the transition from a low level to a high level. Thus, the resetting of the input node 14 in the amplifier unit 15 for the pixel in the first row is started.

After this, from the point-in-time t16 to the point-in-time 23, the readout of the signal for the pixel in the second row is performed. This operation is the same as that of the first row, and so the description of which will be omitted. Besides the difference that the driving pulses, which are the high levels, correspond to the second row, the operations that occur at each point-in-time from the point-in-time t16 to the point-in-time t23 are the same as those that occur during each point-in-time from the point-in-time t8 to the point-in-time t15.

Here, at the point-in-time tAcc between the point-in-time t15 and the point-in-time t16, the PTX4 in all of the rows disposed in the image pickup apparatus and the PMRES1 make the transition from a high level to a low level. Thus, electrons generated by photoelectric conversion are held in the photoelectric conversion unit 8 and the first holding unit. That is to say, the exposure period is started.

With some embodiments, until the exposure period at the point-in-time tAcc starts, PMRES1 is at a high level. That is to say, before the exposure period starts, the electrons in the first holding unit 10 are discharged through the OFD area 112. Preferably, before the exposure period starts, the electrons remaining in the first holding unit 10 are discharged. Accordingly, when starting accumulation of the electrons in the first holding unit 10, the electrons holding in the first holding unit 10 may be decreased, or completely removed.

Conversely, at the point-in-time tAcc, the second charge discharging unit 12 for the pixel in the second row holds electrons. With some embodiments, according to the disposition of the first charge discharging unit 7 which discharges the electrons in the first holding unit 10, the electrons in the first holding unit 10 may be discharged when the second holding unit 12 holds the electrons.

Further, with some embodiments, only the second charge discharging unit 29 may be in a non-conductive state at the point-in-time tAcc. According to such an operation, while the electrons in the first holding unit 10 are discharging, the electrons generated by photoelectric conversion may accumulate in the photoelectric conversion unit 8. In this case, before the electrons in the photoelectric conversion unit 8 are transferred to the first holding unit 10, the PMRES1 makes the transition to the high level.

Further, FIG. 5 illustrates an example of the exposure period starting between the point-in-time t15 and the point-in-time t16. However, the point-in-time tAcc which starts the exposure period is not limited to this case. The point-in-time tAcc which starts the exposure period can exist at any time after the point-in-time t6 which is when electrons are transferred from the first holding unit 10.

According to such an operation, the exposure periods may be equalized regarding all of the pixels disposed in the image pickup area 2. This operation is performed at the entire image pickup surface at the same time until the transfer to the first holding unit 12. The specific point-in-time thereof is the point-in-time t6. Thereafter, readout of all of the rows in the image pickup area 2 is performed by repeating the readout operation.

With some embodiments, enabling the first charge discharging unit 7 and the second charge discharging unit 29 to drive independently improves the degree of freedom for the driving of the image capture apparatus. For example, the first charge discharging unit 9 ends the exposure period by transferring the electrons in the photoelectric conversion unit 8 to the first holding unit 10, and the second charge discharging unit 29 becomes conductive before the second charge transfer unit 11 transfers electrons to the first holding unit 10. According to such an operation, electrons generated at the photoelectric conversion unit 8 are not mixed, and discharged through the second OFD area 202. The result is a decrease in noise.

Also with some embodiments, electrons in the first holding unit 10 are discharged by the first charge discharging unit 7, and electrons in the photoelectric conversion unit 8 are discharged by the second charge discharging unit 29. Thus, regardless of the state of any of the potential of the photoelectric conversion unit 8, the potential of the first holding unit 10, and the potential of the first charge transfer unit 9 between both of these, electrons generated during the shutter period may be discharged. The result is a decrease in noise.

Next, the relationship between potentials with some embodiments will be described. FIGS. 13 through 15 illustrate a relation of height of a potential barrier at each point-in-time and period in the pulse driving diagram illustrated in FIG. 12. FIGS. 13 through 15 illustrate the potentials of the photoelectric conversion unit 8, the first charge transfer unit 9, the first holding unit 10, the second charge transfer unit 11, the second holding unit 12, the third charge transfer unit 13, the input node 14 in the amplifier unit 15 (FD area 107), the first charge discharging unit 7, the OFD area 112, the second charge discharging unit 29, and the second OFD area 202. The potential of pixels for some embodiments are illustrated with a solid line. Potentials are positional energy of signal charges. In FIGS. 13 through 15, the lower part of the diagrams represent signal charges with a low potential, and the upper part of the diagrams represent signal charges with a high potential.

Figure 13A:
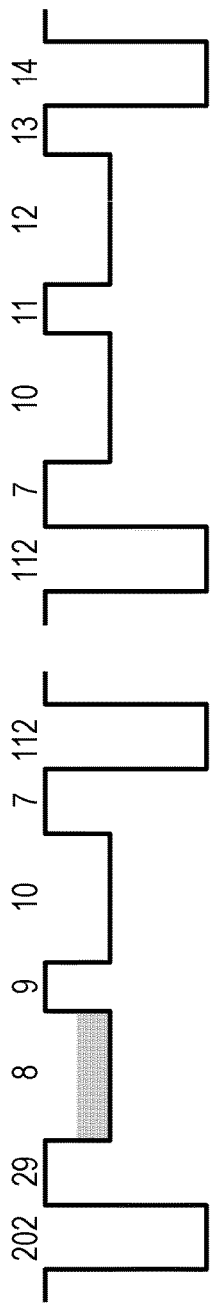
FIGS. 13A to 13D are diagrams representing potential with an embodiment of the image pickup apparatus.

FIG. 13A illustrates the potential state before the point-in-time t1. The first charge transfer unit 9, the second charge transfer unit 11, the third charge transfer unit 13, the first charge discharging unit 7, and the second charge discharging unit 9 are in a non-conductive state. Thus, the potential barrier generated by the first charge transfer unit 9 and the first charge discharging unit 7 is high. As a result, the charge generated by photoelectric conversion is held in the photoelectric conversion unit 8.

With some embodiments, at this time, the potential of the second charge discharging unit 29 and the first charge transfer unit 9 have nearly the same height. The potential of the second charge discharging unit 29 may be lower than the potential of the first charge transfer unit 9. Alternatively, the potential of the second charge discharging unit 29 may be higher than the potential of the first charge transfer unit 9. If the height of the two potentials is different, and electrons over a predetermined amount are generated by the photoelectric conversion unit 8, the electrons will transfer through the channel with the lower potential.

Also with some embodiments, regarding this state, the potential of the photoelectric conversion unit 8, the potential of the first holding unit 10, and the potential of the second holding unit 12 are all nearly the same. These potentials may have different heights.

Figure 13B:
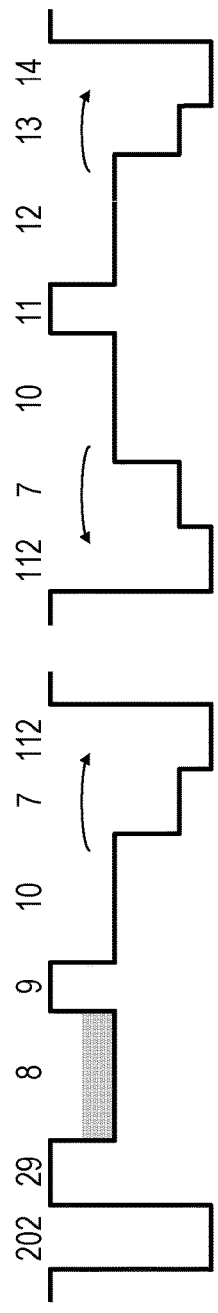

FIG. 13B illustrates the potential state during the period from the point-in-time t1 to the point-in-time t2. As described in FIG. 12, for the period from the point-in-time t1 to the point-in-time t2, a high level pulse is supplied to the third charge transfer unit 13. That is to say, the potential barrier generated at the third charge transfer unit 13 is in a low state. Thus, the electrons in the second holding unit 12 are discharged through the drain of the reset transistor (not depicted in the diagram). It is preferable that electrons do not exist in the second holding unit 12. Also, a high level pulse is supplied to the first charge discharging unit 7. That is to say, the potential barrier generated at the first charge discharging unit 7 is in a low state. Thus, the electrons in the first holding unit 10 are discharged through the OFD area 112. It is preferable that electrons do not exist in the first holding unit 10.

Figure 13C:
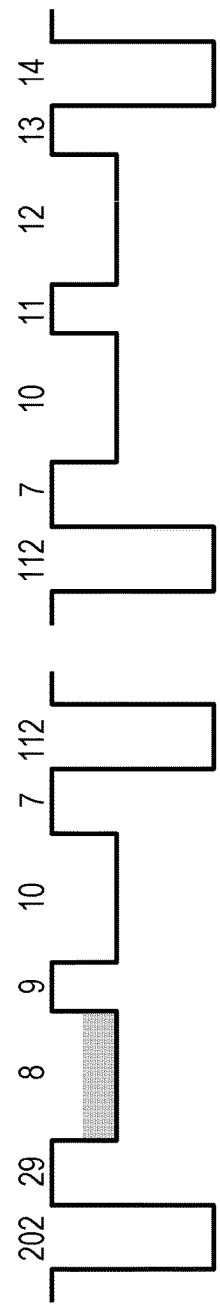

FIG. 13C illustrates the potential state during the period from the point-in-time t2 to the point-in-time t3. The third charge transfer unit 13 and the first charge discharging unit 7 are non-conductive, and so the potential barriers of the third charge transfer unit 13 and the first charge discharging unit 7 are high. This state is the same as that of FIG. 13A.

Figure 13D:
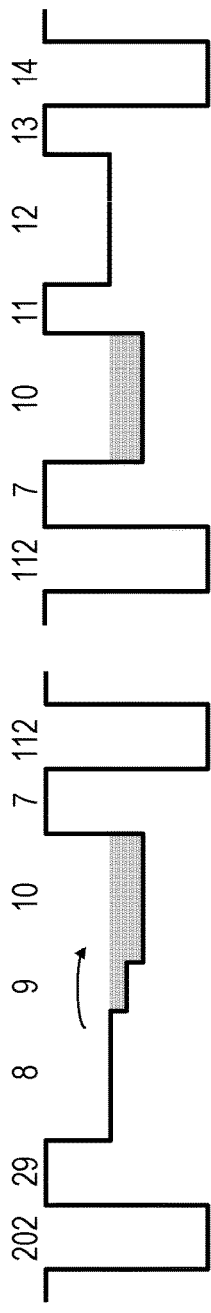

FIG. 13D illustrates the potential state during the period from the point-in-time t3 to the point-in-time t4. At this time, the first charge transfer unit is in a conductive state. Thus, the electrons accumulated in the photoelectric conversion unit 8 are transferred to the first holding unit 10. To increase the transfer efficiency of electrons from the photoelectric conversion unit 8, it is preferable if the potential barrier at the time when the first charge transfer unit 9 is conductive is lower than the potential of the photoelectric conversion unit 8. Further, it is preferable if the potential of the first holding unit 10 is lower than the potential of the photoelectric conversion unit 8.

With some embodiments, the control electrode 102 is shared by the first charge transfer unit 9 and the first holding unit 10. Thus, when the driving pulse is supplied to the first charge transfer unit 9, the potential of the first holding unit 10 lowers. Therefore, as illustrated in FIG. 13A, the potential when there are no electrons in the photoelectric conversion unit 8 may be either the same as the potential of the first holding unit 10, or may be lower.

Figure 14A:
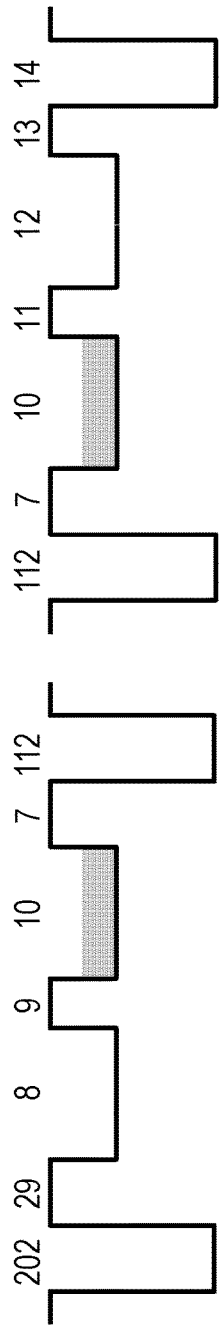
FIGS. 14A to 14D are diagrams representing potential with an embodiment of the image pickup apparatus.

FIG. 14A illustrates the potential state during the period from the point-in-time t4 to the point-in-time tsh. This state illustrated is after the first charge transfer unit 9 changes to a non-conductive state, and before the second charge transfer unit 11 changes to a conductive state. Also, the first charge discharging unit 7 is in a non-conductive state. Thus, the amount of electrons accumulated in the first holding unit 10 is determined by the potential barrier generated by the first charge transfer unit 9 and the first charge discharging unit 7.

Figure 14B:
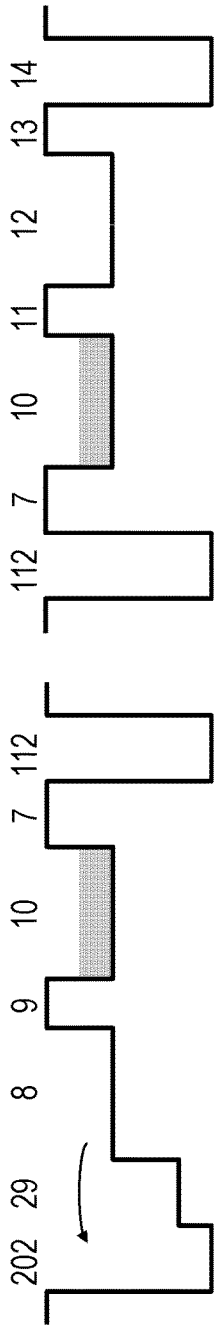

FIG. 14B illustrates the potential state during the period from the point-in-time tsh to the point-in-time t5. The second charge discharging unit 29 is in a conductive state. That is to say, the potential barrier of the second charge discharging unit 29 is in a low state. It is preferable that the potential of the second charge discharging unit 29 is lower than the potential of the photoelectric conversion unit 8. As a result, the charge generated by the photoelectric conversion unit 8 is discharged.

Figure 14C:
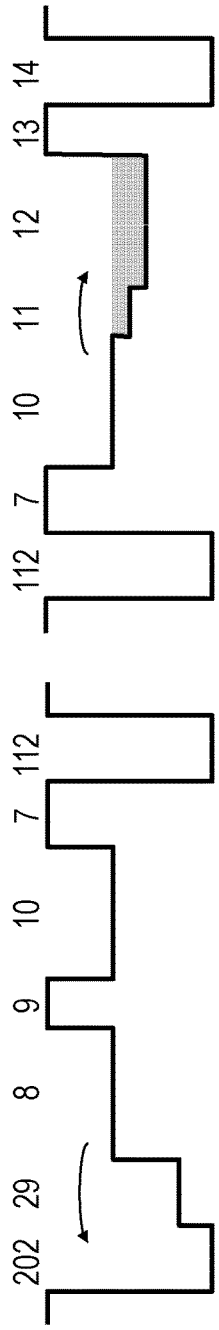

FIG. 14C illustrates the potential state during the period from the point-in-time t5 to the point-in-time t6. The second charge transfer unit 11 is in a conductive state. Thus, the electrons held in the first holding unit 10 are transferred to the second holding unit 12 through the second transfer unit 11. To increase the transfer efficiency of electrons from the first holding unit 10, it is preferable if the potential barrier at the time when the second charge transfer unit 11 is conductive is lower than the potential of the first holding unit 10. Further, the potential of the second holding unit 12 is preferably lower than the potential of the first holding unit 10.

With some embodiments, the control electrode 104 is shared with the second charge transfer unit 11 and the second holding unit 12. Thus, when a driving pulse is supplied to the second charge transfer unit 11, the potential of the second charge transfer unit 11 lowers, and the potential of the second holding unit 12 also lowers. Therefore, as illustrated in FIG. 13A, when all charge transfer units are in a non-conductive state, the potential of the first holding unit 10 may be the same as the potential of the second holding unit 12.

Figure 14D:
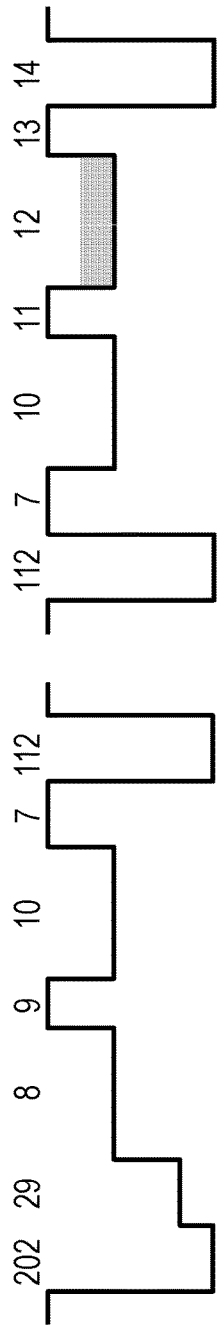

FIG. 14D illustrates the potential state during the period from the point-in-time t6 to the point-in-time t7. Both the second charge transfer unit 11 and the third charge transfer unit 13 are in a non-conductive state, and electrons are accumulated in the second holding unit 12 via their potential barriers.

When the first charge discharging unit 7 is in a conductive state at the point-in-time t7, the potential barrier of the first charge discharging unit 7 in FIG. 14D lowers. Thus, the electrons in the first holding unit 10 are discharged through the OFD area 112.

Figure 15A:
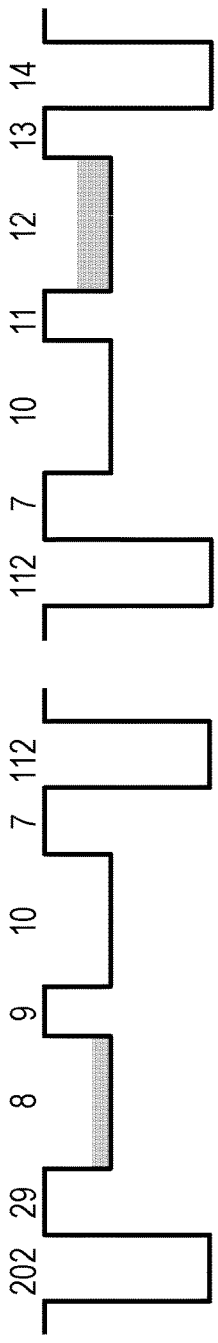
FIGS. 15A to 15C are diagrams representing potential with an embodiment of the image pickup apparatus.

FIG. 15A illustrates the potential state when the first charge discharging unit 7 and the second charge discharging unit 29 are in a non-conductive state, at the point-in-time tAcc. Further, FIG. 15A illustrates the potential state of pixels in the second row that have accumulated a charge at the second holding unit 12 at this time. As illustrated in FIG. 15A, the exposure period may start while electrons are held at the second holding unit 12.

Figure 15B:
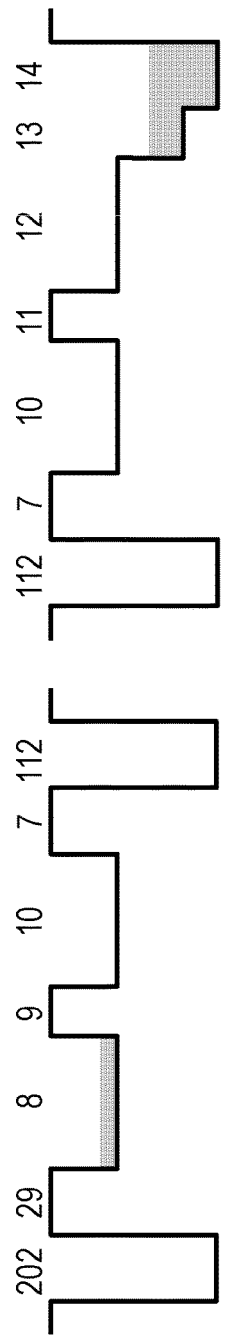
Figure 15C:
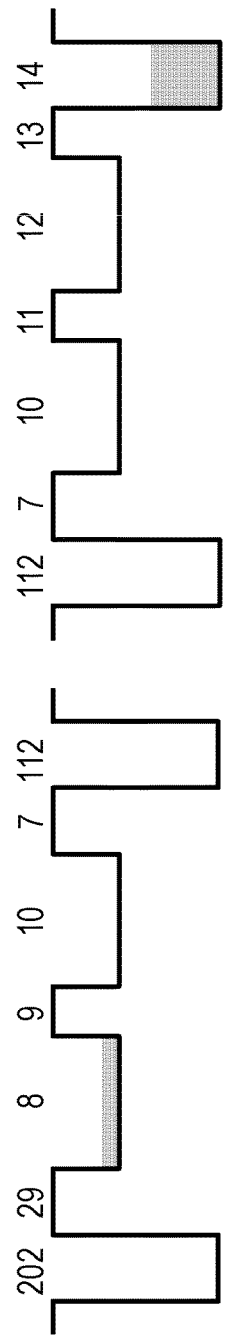

FIG. 15B illustrates the potential state of pixels in the second row during the period from the point-in-time t19 to the point-in-time t20. Electrons in the second holding unit 12 are transferred to the input node 14 in the amplifier unit 15. FIG. 15C illustrates the potential state of pixels in the second row during the period from the point-in-time t20 to the point-in-time t22. The third charge transfer unit 13 is in a non-conductive state.

Further, the potentials of the photoelectric conversion unit 8, the first charge transfer unit 9, the first holding unit 10, the second charge transfer unit 11, the second holding unit 12, the third charge transfer unit 13, the input node 14 in the amplifier unit 15, the first charge discharging unit 7, and the OFD area 112 may be the same as those of the first embodiment.

With some embodiments, when the first charge transfer unit 9 as illustrated in FIG. 13D is in a conductive state, the potential of the first holding unit 10 is lower than the potential of the photoelectric conversion unit 8. According to such a configuration, by connecting the first charge discharging unit to the first holding unit 10, electrons in the first holding unit 10 discharge more easily. As the potential of the photoelectric conversion unit 8 is higher, it is difficult for electrons in the first holding unit 10 to discharge through the photoelectric conversion unit 8.

Further, with some embodiments, the first charge discharging unit 7 may be omitted. In this case, when the first charge transfer unit 9 is in a conductive state, the potential of the first holding unit 10 is higher than the potential of the photoelectric conversion unit 8, and so electrons in the first holding unit 10 are discharged.

Figure 16:
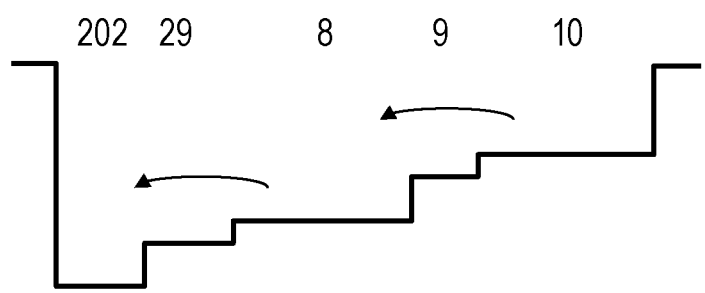
FIG. 16 is a diagram representing potential with an embodiment of the image pickup apparatus.

Regarding pixels omitted by the first charge discharging unit 7 in FIG. 16, this illustrates the potential state when the first holding unit 10 is reset. The potential of the first charge transfer unit 9 is lower than the potential of the first holding unit 10. The potential of the photoelectric conversion unit 8 is lower than the potential of the first charge transfer unit 9. Also, the potential of the second charge discharging unit 29 is lower than the potential of the photoelectric conversion unit 8. As a result, the electrons in the first holding unit 10 are discharged through the second OFD area 202.

Such a potential state may be formed by the relationship between the impurity concentration of the semiconductor region that configures the first holding unit 10 and the semiconductor region that configures the photoelectric conversion unit 8. Alternatively, the previously described potential state may be formed by a voltage applied to the control electrode of the first holding unit 10. At this time, the control electrode of the first charge transfer unit 9 and the control electrode of the first holding unit 10 may be electrically separated. As a result, the potential of the first charge transfer unit 9 and the potential of the first holding unit 10 may be controlled independently. Thus, the potential of the first holding unit 10 may easily be made higher than that of the photoelectric conversion unit 8.

Also, with some embodiments, as illustrated in FIG. 14C, when the second charge transfer unit 11 is in a conductive state, the potential of the second holding unit 12 is lower than the potential of the first holding unit 10. According to such a potential state, the transfer of charges from the first holding unit 10 to the second holding unit 12 may be performed efficiently. Alternatively, according to such a potential state, it is possible to have a complete transfer depletion from the first holding unit 10 to the second holding unit 12. Complete transfer depletion is the transfer of a charge by the depletion of the entire N-type semiconductor region 103, which configures the first holding unit 10.

When the second charge transfer unit 11 is in a conductive state, and with a configuration where the potential of the second holding unit 12 is lower than the potential of the first holding unit 10, it is preferable to connect the reset unit to the input node 14 in the amplifier unit 15. Thus, electrons in the second holding unit 12 may be discharged through the input node 14 in the amplifier unit 15. That is to say, the second holding unit 12 may be reset through the input node 14 in the amplifier unit 15. As the potential of the first holding unit 10 is higher, it is difficult for electrons in the second holding unit 12 to discharge through the first holding unit 10.

Also, the period that electrons are held by the second holding unit 12 may differ for each row. Thus, if there is a large amount of noise generated from the second holding unit 12, there is a potential that image quality will decrease due to shading. In response to this, by decreasing the number of channels connected to the second holding unit, noise generated by the second holding unit 12 may be decreased. Channels are charge transfer paths controlled by the potential. Specifically, it is preferable that the number of channels connected to the second holding unit 12 be two. One is the charge transfer path from the first holding unit 10 to the second holding unit 12. The other is the charge transfer path from the holding unit 12 to the input node 14. Further, there may be other paths for the transfer of charges that overflow from the second holding unit 12.

As described above, with some embodiments, electrons in the first holding unit 10 may be discharged. Such a configuration enables an improvement in image quality of the image pickup apparatus.

Third Embodiment

Another embodiment of the image pickup apparatus will be described. The following some embodiments differ from the second embodiment in that a third charge discharging unit 30 connected to the second holding unit 12 is provided. The other portions are all the same as with the first embodiment or second embodiment. Therefore, with the following some embodiments, only points different from the first and second embodiments will be described, and description will be omitted regarding the other portions.

The overall block configurations of the image pickup apparatuses according to the following some embodiments is the same as with the first embodiment or second embodiment. Specifically, FIG. 1 is an overall block diagram of the image pickup apparatuses according to the following some embodiments.

Figure 17:
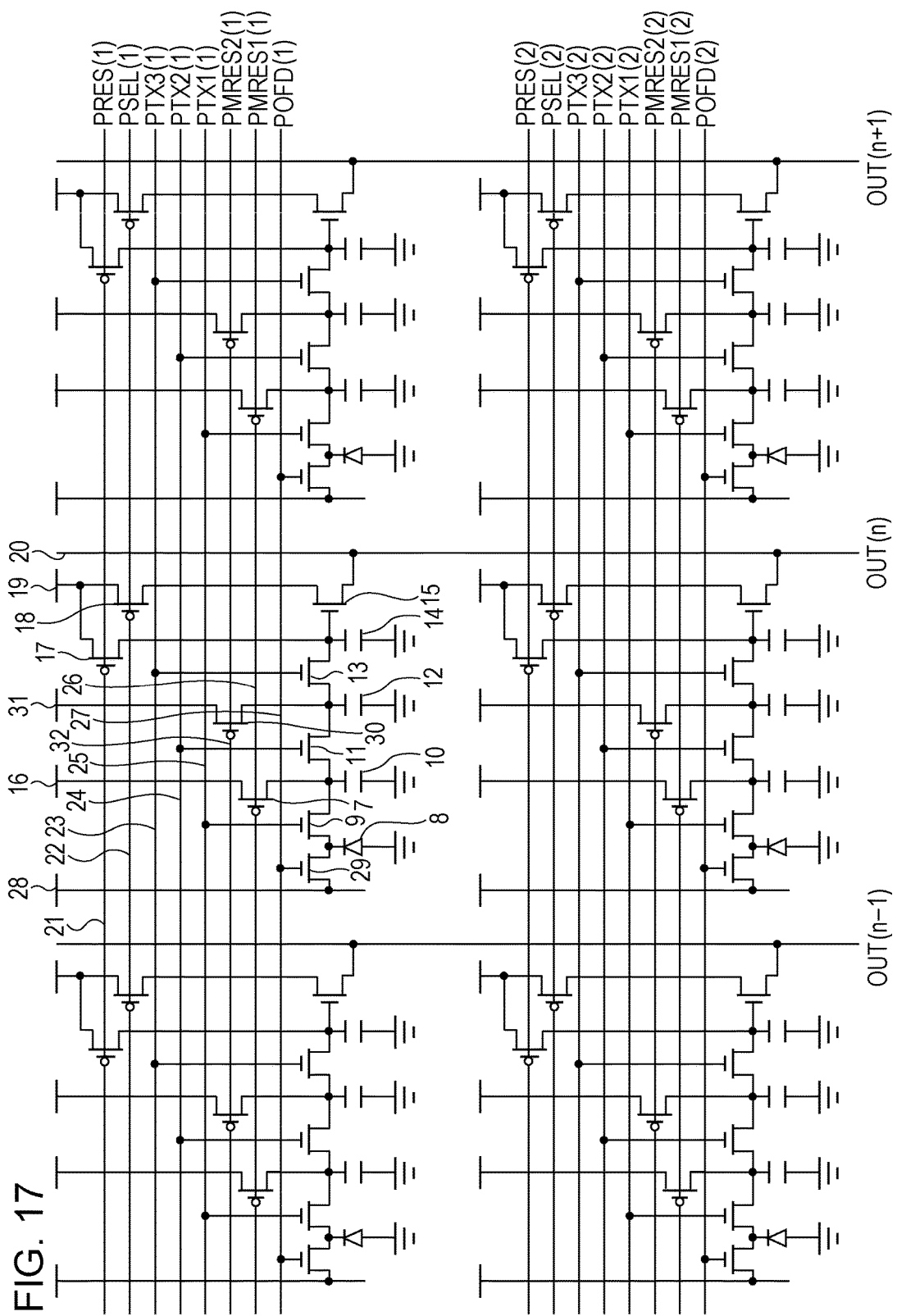
FIG. 17 is a diagram illustrating an equivalent circuit of an embodiment of the image pickup apparatus.

FIG. 17 illustrates an equivalent circuit of image pickup apparatuses according to some embodiments. Portions having the same functions as with FIG. 2 or 9 are denoted with the same reference numerals as with FIG. 2 or 9, and detailed description will be omitted. Here, though six pixels in a total of two rows by three columns are illustrated, an image pickup area may be configured by an even greater number of pixels being disposed.

With some embodiments, the pixels include a third charge discharging unit 30. The third charge discharging unit 30 transfers the electrons of the second holding unit 12 to the OFD area. The OFD area is a charge discharging node from which charge is discharged. The OFD area may be configured of an N-type semiconductor region electrically connected to a wiring 31 which supplies power supply voltage, for example. The third charge discharging unit 30 may be configured to include a control electrode disposed on the semiconductor substrate via the insulating film.

A sixth transfer control wiring 32 supplies a driving pulse PMRES2 to the control electrode (hereinafter, the sixth control gate) which makes up the third charge discharging unit 30. The height of a potential barrier of a semiconductor region below a sixth control gate may be changed with a pulse value to be supplied to the sixth control a gate. That is to say, the third charge discharging unit 30 may control potential of a charge transfer path to be disposed below the control electrode. The other portions of the pixels according to some embodiments are all the same as with the first embodiment.

With some embodiments, at the pixel configuration illustrated with the equivalent circuit exemplified in FIG. 17, the electrical path between the photoelectric conversion unit 8 and the first holding unit 10 may have the following configuration. The configuration thereof is a configuration wherein the first charge transfer unit 9 disposed in the electrical path between the photoelectric conversion unit 8 and the first holding unit 10 is in a non-conductive state, and electrons are allowed to be moved from the photoelectric conversion unit 8 to the first holding unit 10. Here, the non-conductive state is a state in which of pulse values to be supplied to the first charge transfer unit 9, a pulse value to generate the highest potential barrier has been supplied. Accordingly, the first charge transfer unit 9 does not have to be so-called completely off, and the non-conductive state of the first charge transfer unit 9 also includes a state in which some sort of potential barrier has occurred as compared to a case where the first charge transfer unit 9 has completely been turned on.

For example, in the event that a MOS transistor is the first charge transfer unit 9, a specific configuration may be realized by this MOS transistor having an embedded channel configuration. More generally speaking, this configuration is a configuration wherein there is a portion in an area deeper than the surface where the potential barrier for an electrode is lower than the surface when the first charge transfer unit 9 is in a non-conductive state. In this case, a driving pulse to be supplied to the first charge transfer unit 9 may be a fixed value. That is to say, s fixed potential barrier may be employed instead of a configuration wherein two states of a conductive state and a non-conductive state are switchable.

According to such a configuration, when light is input to the photoelectric conversion unit 8, almost of electrons generated by photoelectric conversion are moved to the first holding unit 10 during the exposure period. Accordingly, the accumulation periods of all of the pixels disposed in the image pickup area 2 may be aligned by performing transfer of charge from the first holding unit 10 to the second holding unit 12 in parallel.

Further, when the first charge transfer unit 9 is in a non-conductive state, a hole is accumulated on the surface. Also, the channel where electrons move exists in a predetermined depth portion from the surface, and accordingly, influence of dark current may be reduced as compared to a case where electrons move in an interface between the semiconductor substrate and the insulating film.

Alternatively, the electrical path between the photoelectric conversion unit 8 and the first holding unit 10 may have another configuration. The other configuration is a configuration wherein the first charge transfer unit 9 disposed in the electrical path between the photoelectric conversion unit 8 and the first holding unit 10 is in a non-conductive state, and no electrons are moved from the photoelectric conversion unit 8 to the first holding unit 10. Here, the non-conductive state is a state in which of pulse values to be supplied to the first charge transfer unit 9, a pulse value to generate the highest potential barrier has been supplied. In other words, this is a configuration wherein the majority of electrons generated by photoelectric conversion is accumulated in the photoelectric conversion unit 8.

During a period for accumulating electrons at the photoelectric conversion unit 8, a lower potential barrier than the potential barrier at the first charge transfer unit 9 is formed, and accordingly, a configuration wherein no electrons are moved from the photoelectric conversion unit 8 to the first holding unit 10 may be obtained. As for a specific configuration, when the first charge transfer unit 9 and second charge discharging unit 29 are in a non-conductive state, a potential barrier to be formed below the first control gate is higher than a potential barrier to be formed below the fifth control gate. Note that, when the first charge transfer unit 9 and second charge discharging unit 7 are in a non-conductive state, electrons may be accumulated at the photoelectric conversion unit 8.

According to such a configuration, the majority of electrons generated by photoelectric conversion at the time of light being input to the photoelectric conversion unit 8 is accumulated in the photoelectric conversion unit 8 during the exposure period. Accordingly, with all of the pixels disposed in the image pickup area 2, charge accumulated in the photoelectric conversion units 8 is simultaneously transferred to the first holding units 10, whereby the accumulation periods of all of the pixels may be aligned.

A specific configuration of pixels according to some embodiments will be described with reference to FIG. 18. Portions having the same function as with FIG. 3 or 10 are denoted with the same reference numerals. Portions denoted with the same reference numerals as with FIG. 3 or 10 are the same as with the first or second embodiment, and accordingly, detailed description will be omitted.

Figure 18:
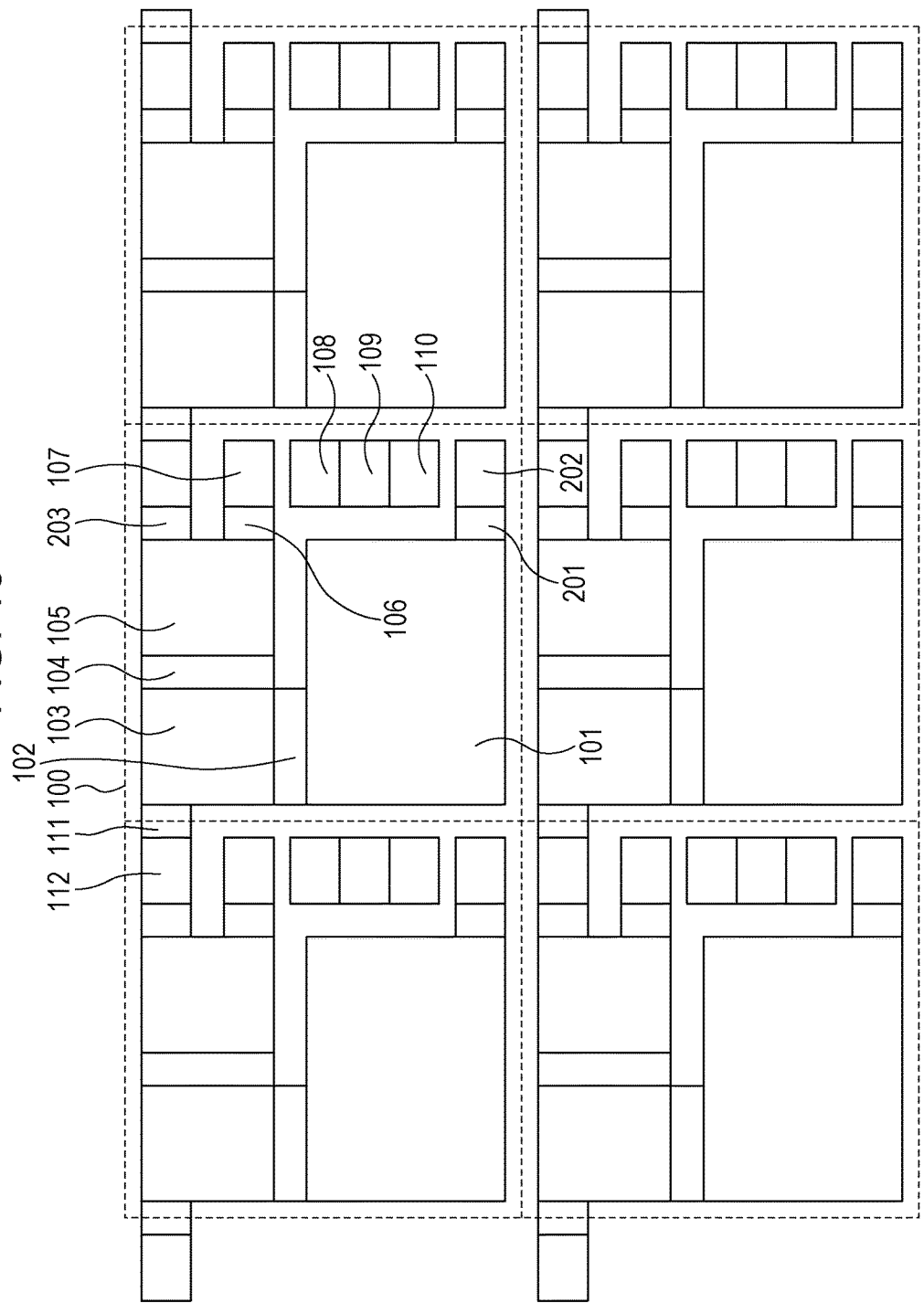
FIG. 18 is a schematic view illustrating the top face of an embodiment of the image pickup apparatus.

FIG. 18 illustrates a top view of the image pickup apparatuses according to some embodiments. Here, though six pixels in a total of two rows by three columns are illustrated, an image pickup area may be configured by an even greater number of pixels being disposed.

The pixels 100 include a control electrode 203 which makes up the third charge discharging unit 30. The other portions thereof are the same as with the first embodiment. Note that the charge discharging node of the third charge discharging unit 30 is the OFD area which is common to the charge discharging node of the first charge discharging unit 7 (control electrode 111) of an adjacent pixel. The present is not restricted to this, and the charge discharging node of the first charge discharging unit 7 and the charge discharging node of the third charge discharging unit 30 may be different semiconductor regions. Also, the charge discharging node of the third charge discharging unit 30 may be shared with the source or drain of the reset transistor, selecting transistor, or amplifier transistor.

The control electrode 203 included in the third charge discharging unit 30 is disposed adjacent to the N-type semiconductor region 105 with a planar view. According to such displacement, the third charge discharging unit 30 may discharge the charge of the second holding unit 12. The third charge discharging unit 30 may be a MOS transistor configured of the control electrode 203, N-type semiconductor region 105, and OFD area 112.

A cross-sectional configuration according to some embodiments may be the same as with the first embodiment or second embodiment. Also, a driving method according to some embodiments may be the same as with the first embodiment or second embodiment. However, when resetting the second holding unit 12, the third charge discharging unit 30 is electrically conducted.

Fourth Embodiment

Figure 19:
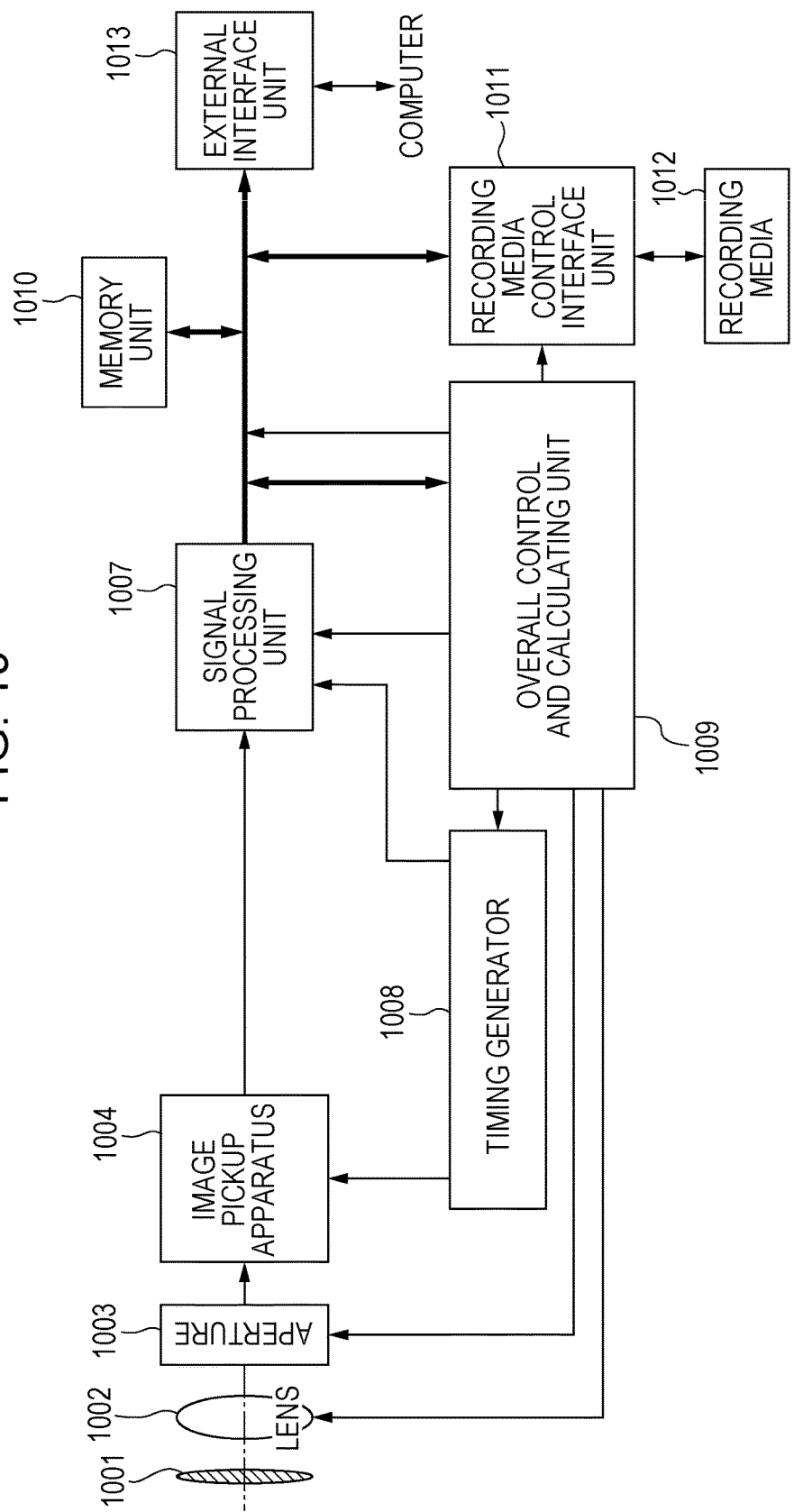
FIG. 19 is a block diagram of an image pickup system.

An embodiment of an image pickup system will be described. Examples of the image pickup system include digital still cameras, digital cam coders, duplicating machines, fax machines, cellular phones, in-vehicle cameras, and observation satellites. FIG. 19 illustrates a block diagram of a digital still camera as an example of the image pickup system.

In FIG. 19, reference numeral 1001 denotes a barrier for protecting a lens, 1002 denotes a lens which causes an image pickup apparatus 1004 to form an optical image of a subject, and 1003 denotes an aperture for varying the amount of light passed through the lens 1002. Reference numeral 1004 denotes an image pickup apparatus described in the above-mentioned embodiments, which converts an optical image formed by the lens 1002 as image data. Now, let us say that an AD conversion unit has been formed on the semiconductor substrate of the image pickup apparatus 1004. Reference numeral 1007 denotes a signal processing unit which subjects image pickup data output from the image pickup apparatus 1004 to various types of corrections, or compresses the data. In FIG. 19, reference numeral 1008 denotes a timing generator which outputs various timing signals to the image pickup apparatus 1004 and signal processing unit 1007, and 1009 denotes an overall control unit which controls the entire digital still camera. Reference numeral 1010 denotes a frame memory unit for temporarily storing image data, 1011 denotes an interface unit for performing recording in or readout from a recording medium, and 1012 denotes a detachable recording medium such as semiconductor memory for recording or readout of image data. Reference numeral 1013 denotes an interface unit for communicating with an external computer or the like. Here, a timing signal and so forth may be input out of the image pickup system, and the image pickup system may include at least the image pickup apparatus 1004 and the signal processing unit 1007 which processes an image pickup signal output from the image pickup apparatus 1004.

With some embodiments, the configuration has been described wherein the image pickup apparatus 1004 and AD conversion unit are formed on the same semiconductor substrate. However, the image pickup apparatus 1004 and AD conversion unit may be provided to another semiconductor substrate. Also, the image pickup apparatus 1004 and signal processing unit 1007 may be formed on the same substrate.

As described above, the image pickup apparatus according to embodiments may be applied to the image pickup system. The image quality of the image pickup system may be improved by applying the image pickup apparatus according to embodiments to the image pickup system.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:
1. An image pickup apparatus comprising a plurality of pixels, each of the plurality of pixels including:
 a photoelectric conversion unit;

a first holding unit configured to hold a charge generated by the photoelectric conversion unit, at a location different from location of the photoelectric conversion unit;

a second holding unit configured to hold a charge held by the first holding unit at a location different from locations of both of the first holding unit and the photoelectric conversion unit;

an amplifying unit including an input node connected to a third holding unit and configured to output a signal based on a charge transferred to the input node from the second holding unit, the input node being a different node from the second holding unit, a first transfer unit connected between the photoelectric conversion unit and the first holding unit and configured to transfer a charge from the photoelectric conversion unit to the first holding unit;

a second transfer unit connected between the first holding unit and the second holding unit and configured to transfer a charge from the first holding unit to the second holding unit;

a third transfer unit connected between the second holding unit and the third holding unit and configured to transfer a charge from the second holding unit to the third holding unit;

a first discharge unit configured to discharge a charge of the first holding unit, wherein the first discharge unit includes a charge draining node which is a node different from the input node; and wherein the first discharge unit is configured to discharges a charge held by the first holding unit to the charge draining node.

2. The image pickup apparatus according to claim 1, wherein a charge is transferred from the photoelectric conversion unit to the first holding unit via a first path;

wherein a charge is transferred from the first holding unit to the second holding unit via a second path; and wherein the first discharge unit discharges the charge of the first holding unit via a third path which differs from both of the first path and the second path.

3. The image pickup apparatus according to claim 1, wherein each of the plurality of pixels includes a reset unit configured to reset voltage of the input node.

4. The image pickup apparatus according to claim 3, wherein the reset unit is configured to discharge the charge of the second holding unit via the input node.

5. The image pickup apparatus according to claim 1, wherein the first discharge unit is configured to discharge a charge of the photoelectric conversion unit via the first holding unit.

6. The image pickup apparatus according to claim 1, wherein each of the plurality of pixels includes a second discharge unit configured to discharge a charge of the photoelectric conversion unit;

wherein the second discharge unit includes a second charge draining node;

wherein the second charge draining node is electrically connected to a line to which a predetermined voltage is to be supplied; and wherein the second discharge unit configured to discharge a charge of the photoelectric conversion unit to the charge draining node.

7. The image pickup apparatus according to claim 1, further comprising a control unit;

wherein the control unit is configured to control the first discharge unit to discharge a charge of the first holding unit in parallel with holding, by the second holding unit, a charge thereof.

8. The image pickup apparatus according to claim 1, wherein the first transfer unit, the second transfer unit and the third transfer unit are provided in a serial electrical path from the photoelectric conversion unit to the input node.

9. An image pickup system comprising:

the image pickup apparatus according to claim 1; and a signal processing unit which processes signals output from the image pickup apparatus.

10. The image pickup apparatus according to claim 1, wherein the third holding unit includes a floating diffusion portion disposed in a semiconductor substrate.

* * * * *